United States Patent [19]
Unami et al.

[11] Patent Number: 5,900,790
[45] Date of Patent: May 4, 1999

[54] PIEZOELECTRIC RESONATOR, MANUFACTURING METHOD THEREFOR, AND ELECTRONIC COMPONENT USING THE PIEZOELECTRIC RESONATOR

[75] Inventors: Toshihiko Unami, Omihachiman; Tetsuo Takeshima, Toyama; Toshiyuki Baba, Moriyama; Shigemasa Kusabiraki, Takoaka; Hirohide Yoshino, Toyama-ken; Jiro Inoue, Omihachiman, all of Japan

[73] Assignee: Murata Manuafacturing Co., Ltd., Kyoto-fu, Japan

[21] Appl. No.: 08/845,953

[22] Filed: Apr. 30, 1997

[30] Foreign Application Priority Data

Aug. 5, 1996 [JP] Japan .................................. 8-223028

[51] Int. Cl.$^6$ .............................. H03H 9/10; H03H 9/205
[52] U.S. Cl. ...................... 333/187; 333/189; 310/321; 310/348; 310/359; 310/366; 310/367
[58] Field of Search .................................. 333/186–192; 310/311, 321, 328, 348, 357, 359, 366, 367

[56] References Cited

U.S. PATENT DOCUMENTS

| | | | |
|---|---|---|---|
| 2,157,665 | 5/1939 | Hollmann | 310/315 |
| 3,185,869 | 5/1965 | Shoor | 310/315 |
| 3,297,889 | 1/1967 | Breskend | 310/315 |
| 3,401,275 | 9/1968 | Curran et al. | 333/189 |
| 3,590,287 | 6/1971 | Berlincourt et al. | 310/366 X |
| 4,087,716 | 5/1978 | Heywang | 310/359 X |
| 4,360,754 | 11/1982 | Toyoshima et al. | 310/366 |
| 4,398,117 | 8/1983 | St. Cyr | 310/348 |
| 4,503,352 | 3/1985 | Inoue | 333/187 X |
| 4,532,451 | 7/1985 | Inoue | 310/359 X |
| 4,542,315 | 9/1985 | Yamamoto et al. | 310/348 |
| 4,564,782 | 1/1986 | Ogawa | 333/191 X |
| 4,570,098 | 2/1986 | Tomita et al. | 310/346 |
| 4,633,120 | 12/1986 | Sato et al. | 310/328 |
| 4,642,510 | 2/1987 | Yamashita | 310/348 |

(List continued on next page.)

FOREIGN PATENT DOCUMENTS 5-160459   6/1993   Japan ..................................... 310/366

*Primary Examiner*—Robert Pascal
*Assistant Examiner*—Barbara Summons
*Attorney, Agent, or Firm*—Graham & James LLP

[57] ABSTRACT

A piezoelectric resonator has a base member formed by laminating a plurality of piezoelectric layers and electrodes. The base member is polarized in different directions at both sides of each electrode. Electrodes are alternately covered by a first insulating film and a second insulating film, respectively, at both sides of a groove formed in the base member. The first insulating film covers electrodes which are not covered by the second insulating film, and vice versa. External electrodes are formed at both sides of the groove on the base member and the internal electrodes are connected to the external electrodes. A support member made from an electrically conductive material is provided at the approximate centers of the external electrodes.

20 Claims, 18 Drawing Sheets

U.S. PATENT DOCUMENTS

| | | | |
|---|---|---|---|
| 4,656,385 | 4/1987 | Tanaka | 310/348 |
| 4,752,712 | 6/1988 | Tomita et al. | 310/328 |
| 4,759,107 | 7/1988 | Ogawa et al. | 310/366 X |
| 4,780,639 | 10/1988 | Shirasu | 310/328 |
| 4,885,498 | 12/1989 | Wakita | 310/328 |
| 5,045,744 | 9/1991 | Ando et al. | 310/366 X |
| 5,118,982 | 6/1992 | Inoue et al. | 310/328 X |
| 5,126,618 | 6/1992 | Takahashi et al. | 310/346 |
| 5,153,477 | 10/1992 | Jomura et al. | 310/366 X |
| 5,225,731 | 7/1993 | Owen | 310/366 |
| 5,233,256 | 8/1993 | Hayashi et al. | 310/317 |
| 5,237,239 | 8/1993 | Inoue et al. | 310/328 |
| 5,241,236 | 8/1993 | Sasaki et al. | 310/358 |
| 5,250,870 | 10/1993 | Fenlon et al. | 310/345 |
| 5,381,067 | 1/1995 | Greenstein et al. | 310/359 X |
| 5,438,232 | 8/1995 | Inoue et al. | 310/328 |
| 5,446,485 | 8/1995 | Usui | 347/72 |
| 5,517,073 | 5/1996 | Ohkuma | 310/315 |
| 5,523,645 | 6/1996 | Inoi | 310/328 X |
| 5,525,944 | 6/1996 | Oyama | 333/189 |
| 5,548,179 | 8/1996 | Kaida | 310/348 X |
| 5,565,824 | 10/1996 | Nagano | 333/189 |
| 5,572,082 | 11/1996 | Sokol | 310/366 |
| 5,585,687 | 12/1996 | Wakabayashi et al. | 310/366 |
| 5,596,243 | 1/1997 | Tsuru et al. | 310/348 |
| 5,596,244 | 1/1997 | Kugou et al. | 310/348 |
| 5,696,472 | 12/1997 | Kaida | 333/189 |
| 5,705,880 | 1/1998 | Shimura et al. | 310/366 |
| 5,717,365 | 2/1998 | Kaida et al. | 333/187 |

PIEZOELECTRIC RESONATOR, MANUFACTURING METHOD THEREFOR, AND ELECTRONIC COMPONENT USING THE PIEZOELECTRIC RESONATOR

BACKGROUND OF THE INVENTION

1. Field of the Invention

The present invention relates to piezoelectric resonators, manufacturing methods therefor, and electronic components using the piezoelectric resonators, and more particularly, to a novel piezoelectric resonator which maximizes the effective use of the mechanical resonance of a piezoelectric member, a manufacturing method therefor, and electronic components containing the novel piezoelectric resonator, such as an oscillator, a discriminator, and a filter.

2. Description of the Related Art

FIG. 28 is a perspective view of a conventional piezoelectric resonator. A piezoelectric resonator 1 includes a single piezoelectric substrate 2 having, for example, a rectangular plate shape as viewed from above. The piezoelectric substrate 2 is polarized in the thickness direction. On two opposite major surfaces of the piezoelectric substrate 2, electrodes 3 are provided. When a signal is input between the electrodes 3, an electrical field is applied to the single piezoelectric substrate 2 in the thickness direction and the single piezoelectric substrate 2 vibrates in the longitudinal direction.

In FIG. 29, there is shown a piezoelectric resonator 1 in which electrodes 3 are provided on two opposite major surfaces of a single piezoelectric substrate 2 having a square plate shape as viewed from above. The single piezoelectric substrate 2 of the piezoelectric resonator 1 is polarized in the thickness direction. When a signal is input between the electrodes 3 in the piezoelectric resonator 1, an electrical field is applied to the single piezoelectric substrate 2 in the thickness direction and the single piezoelectric substrate 2 vibrates in a square-type vibration mode (in the plane direction).

To produce an electronic component using the piezoelectric resonator 1, the piezoelectric resonator 1 is mounted on an insulating substrate 5 on which pattern electrodes 4 are provided, as shown in FIG. 30. The center of the piezoelectric resonator 1, which serves as a node, is supported by a support member 6 formed on a pattern electrode 4 so as to not interfere with the vibration of the piezoelectric resonator 1. The support member 6 is made from an electrically conductive material and electrically connects a pattern electrode 4 to one electrode 3 of the piezoelectric resonator 1. The other electrode 3 of the piezoelectric resonator 1 is connected to the other pattern electrode 4 via a lead wire 7. A metal cap 8 is placed on the insulating substrate 5. Since the support member 6 supports only the center of the piezoelectric resonator 1, which serves as a node, the vibration of the piezoelectric substrate 2 is not damped and the characteristics of the piezoelectric resonator 1 are prevented from deteriorating.

These piezoelectric resonators are of an unstiffened type, in which the vibration direction differs from the direction of polarization and the electrical field. The electromechanical coupling coefficient of such an unstiffened piezoelectric resonator is lower than that of a stiffened piezoelectric resonator, in which each of the vibration direction, the direction of polarization, and the direction in which an electrical field is applied are the same. An unstiffened piezoelectric resonator has a relatively small frequency difference ΔF between the resonant frequency and the antiresonant frequency. This leads to a drawback in which a frequency-band width in use is narrow when an unstiffened frequency resonator is used as an oscillator or a filter. Therefore, the degree of freedom and flexibility in resonator characteristics design is low in such a piezoelectric resonator and electronic components using the same.

The piezoelectric resonator shown in FIG. 29 uses the first-order resonance in the longitudinal mode. Because of its structure, the piezoelectric resonator of FIG. 29 also generates large spurious resonances in odd-number-order harmonic modes, such as the third-order and fifth-order modes, and in a width mode. To suppress these spurious resonances, some solutions have been considered, such as polishing, increasing mass, and changing the shape of the electrode. These solutions increase manufacturing cost.

In addition, since the piezoelectric substrate has a rectangular plate shape, the substrate cannot be made thinner without sacrificing required strength. Therefore, the distance between the electrodes cannot be reduced and a capacitance between terminals cannot be increased. This makes it extremely difficult to achieve impedance matching with an external circuit. To form a ladder filter by alternately connecting a plurality of piezoelectric resonators in series and in parallel, the capacitance ratio of the series resonator to the parallel resonator needs to be made large in order to increase attenuation. Because a piezoelectric resonator has the shape and structural restrictions described above, however, large attenuation cannot be obtained.

In the piezoelectric resonator shown in FIG. 30, large spurious resonances such as those in the thickness mode and in the triple-wave mode in the plane direction are generated. Since the piezoelectric resonator needs a large size as compared with a piezoelectric resonator using the longitudinal vibration in order to obtain the same resonant frequency, it is difficult to reduce the size of the piezoelectric resonator. When a ladder filter is formed by a plurality of piezoelectric resonators, in order to increase the capacitance ratio between the series resonator and the parallel resonator, the resonators connected in series must have an increased thickness and electrodes are formed only on part of a piezoelectric substrate to make the capacitance small. In this case, since the electrodes are only partially formed, the difference ΔF between the resonant frequency and the antiresonant frequency as well as the capacitance is reduced. The resonators connected in parallel are accordingly required to have small ΔF. As a result, the piezoelectricity of the piezoelectric substrate is not effectively used, and the transmission band width of the filter cannot be increased.

When an electronic component is produced using the piezoelectric resonator, it is necessary to use a lead wire to connect the piezoelectric resonator to a pattern electrode on the insulating substrate. This increases manufacturing steps and production cost. The pattern electrode is formed on the support member and the piezoelectric resonator is secured to the support member. Strict precision is required in placing the center of the piezoelectric resonator on the support member. If the support position shifts, the vibration of the piezoelectric resonator leaks and superior resonator characteristics cannot be obtained.

SUMMARY OF THE INVENTION

The preferred embodiments of the present invention provide a piezoelectric resonator having a small spurious resonance, a large difference ΔF between the resonant frequency and the antiresonant frequency, easily adjustable capacitance and ΔF, and a large degree of freedom in resonator characteristics design, and also provide an improved manufacturing method for the novel piezoelectric resonator.

The preferred embodiments of the present invention also provide an electronic component including a piezoelectric resonator which is manufactured at a substantially low cost and which prevents deterioration of resonator characteristics.

The preferred embodiments of the present invention further provide a method for manufacturing such a piezoelectric resonator, which method allows the piezoelectric resonators to be easily mass-produced.

According to one preferred embodiment of the present invention, a piezoelectric resonator comprises a base member which includes a piezoelectric member; an active section being defined by a first portion of the piezoelectric member which is polarized in a longitudinal direction of the base member and generates longitudinal basic vibration in the base member when an electric field is applied in the longitudinal direction of the base member; at least one pair of internal electrodes disposed in the active section such that the electrodes are substantially perpendicular to a longitudinal direction of the base member, the ends of the electrodes being exposed at a first side surface of the base member; a first insulating film covering alternate internal electrodes at the first side surface at a first end of the first side surface of the base member; a second insulating film covering internal electrodes exposed at the first side surface which are not covered by the first insulating film at a second end of the first side surface of the base member; and two external electrodes arranged such that they extend in the longitudinal direction at the first end and the second end of the first side surface of the base member, the two external electrodes being connected to internal electrodes exposed at each end of the first side surface without being covered by the insulating films.

In the piezoelectric resonator, a groove may be formed between the two external electrodes on the first side surface of the base member.

In the piezoelectric resonator, an electrically conductive support member may be provided on the two external electrodes preferably at the approximate center of the base member.

According to another preferred embodiment of the present invention, an electronic component includes the above-described piezoelectric resonator, and an insulating substrate on which a pattern electrode is disposed, the pattern electrode being connected to the external electrodes of the piezoelectric resonator via the support member.

The electronic component may function as a ladder filter by forming a plurality of the pattern electrodes on the insulating substrate, the pattern electrodes being connected to the external electrodes of a plurality of the piezoelectric resonators and a plurality of the piezoelectric resonators being connected in a ladder arrangement.

According to another preferred embodiment of the present invention, a manufacturing method for a piezoelectric resonator includes the steps of: preparing a laminated base member in which a plurality of piezoelectric layers and a plurality of internal electrodes are laminated; forming an insulating film on a surface of the laminated base member at which ends of the internal electrodes are exposed; forming an external electrode on the surface of the laminated base member on which the insulating film is formed; providing a support member on the external electrode with an electrically conductive material; and forming a groove on the surface of the laminated base member on which the external electrode is formed and cutting the laminated base member substantially parallel to the groove.

In the manufacturing method for a piezoelectric resonator, the insulating film may preferably be formed in a check pattern such that, one row of the insulating film covers alternate exposed portions of the internal electrodes and the adjacent rows of the insulating film covering the other alternate exposed portions of the internal electrodes.

In the manufacturing method for a piezoelectric resonator, the support member may be arranged substantially parallel to the internal electrodes so that the support member is preferably located at the approximate center after the laminated base member is cut.

In the manufacturing method for a piezoelectric resonator, the groove may be formed between adjacent rows of the insulating film formed in the check pattern, and the laminated member may be cut along the rows of the insulating film formed in the check pattern.

In the manufacturing method for a piezoelectric resonator, polarizing electrodes are preferably formed on opposite surfaces of a laminated base to which the internal electrodes alternately extend in the laminated base member, the laminated base member is polarized by applying a DC voltage to the polarizing electrodes, and a piezoelectric resonator is formed by cutting the laminated member substantially perpendicularly to the surfaces of the internal electrodes.

The piezoelectric resonator according to the preferred embodiments of the present invention is a stiffened type resonator, and has an active section in which each of the vibration direction, the direction of polarization, and the direction in which an electrical field is applied are the same. Therefore, as compared with an unstiffened piezoelectric resonator, in which the vibration direction differs from the direction of polarization and electrical field, the stiffened piezoelectric resonator has a larger electromechanical coupling coefficient and a larger frequency difference $\Delta F$ between the resonant frequency and the antiresonant frequency. In addition, vibrations in modes such as the width and thickness modes, which are different from the basic vibration, are unlikely to occur in a stiffened piezoelectric resonator. Furthermore, the capacitance can be easily adjusted by changing the number of electrodes which are used for applying an electric field to the active section, the distances thereof, and the size thereof. The frequency difference $\Delta F$ and the resonant frequency can be adjusted by reducing or increasing the size or mass of an inactive section which does not vibrate unlike an active section.

When electronic components such as an oscillator, a discriminator, and a filter are made using the piezoelectric resonator, the piezoelectric resonator is preferably mounted on an insulating substrate on which pattern electrodes are formed and is preferably covered by a cap to form chip-type surface-mountable electronic components. Since the piezoelectric resonator has two external electrodes disposed on one side surface of the base member, the resonator can be mounted to a pattern electrode by surface bonding without the use of a lead wire. If a support member is formed at approximately the center of the base member in advance, the node of the piezoelectric resonator can be positively and reliably supported when the piezoelectric resonator is mounted on a pattern electrode.

The piezoelectric resonator according to the preferred embodiments of the present invention can be mass-produced by forming insulating film, an external electrode, and a support member on a laminated member, forming a groove, and cutting the laminated member.

According to the preferred embodiments of the present invention, the frequency difference ΔF between the resonant frequency and the antiresonant frequency is large as compared with a conventional piezoelectric resonator, and thus a wide-frequency-band resonator is obtained. Since the frequency difference ΔF is adjusted by adjusting the size and mass of the inactive section, the frequency-band width of the piezoelectric resonator can be easily changed. In addition, vibrations in modes other than the basic-vibration mode are unlikely to occur in this piezoelectric resonator, and superior resonator characteristics are achieved. Furthermore, since the capacitance of the piezoelectric resonator can be adjusted, it is easy to achieve impedance matching with an external circuit when the piezoelectric resonator is mounted on a circuit board.

An electronic component is produced with this piezoelectric resonator at low cost since the piezoelectric resonator is preferably connected to a pattern electrode on the insulating substrate without the use a lead wire. An electronic component having superior characteristics is obtained because the piezoelectric resonator is not prevented from vibrating, because of a support member formed on the piezoelectric resonator. When a ladder filter is made using a plurality of piezoelectric resonators according to the preferred embodiments of the present invention, it is manufactured at low cost while having superior resonator characteristics.

Since a chip-type electronic component can be made using the piezoelectric resonator, it is easy to mount the component on a circuit board. It is also easy to achieve impedance matching between such an electronic component and an external circuit by easily adjusting the capacitance of the piezoelectric resonator. In addition, in a ladder filter formed by alternately connecting a plurality of piezoelectric resonators in series and in parallel, attenuation in the filter can be adjusted by changing the ratio of the capacitance of the piezoelectric resonator connected in series to that of the piezoelectric resonator connected in parallel.

According to the method for manufacturing a piezoelectric resonator of the preferred embodiments of the present invention, the piezoelectric resonator achieving the above-described advantages can be easily and efficiently mass-produced. Therefore, such a piezoelectric resonator can be manufactured at low cost.

These and other elements, features, and advantages of the preferred embodiments of the present invention will be apparent from the following detailed description of the preferred embodiments of the present invention, as illustrated in the accompanying drawings.

DETAILED DESCRIPTION OF PREFERRED EMBODIMENTS

Figure 1:
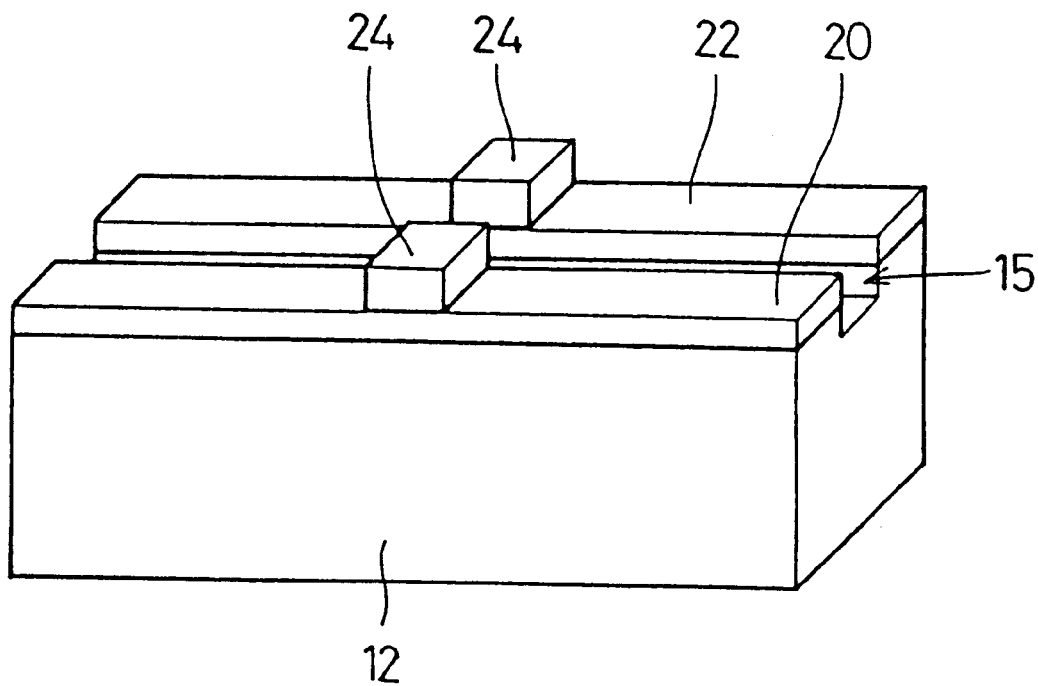
FIG. 1 is a perspective view of a piezoelectric resonator according to the preferred embodiments of the present invention.
Figure 2:
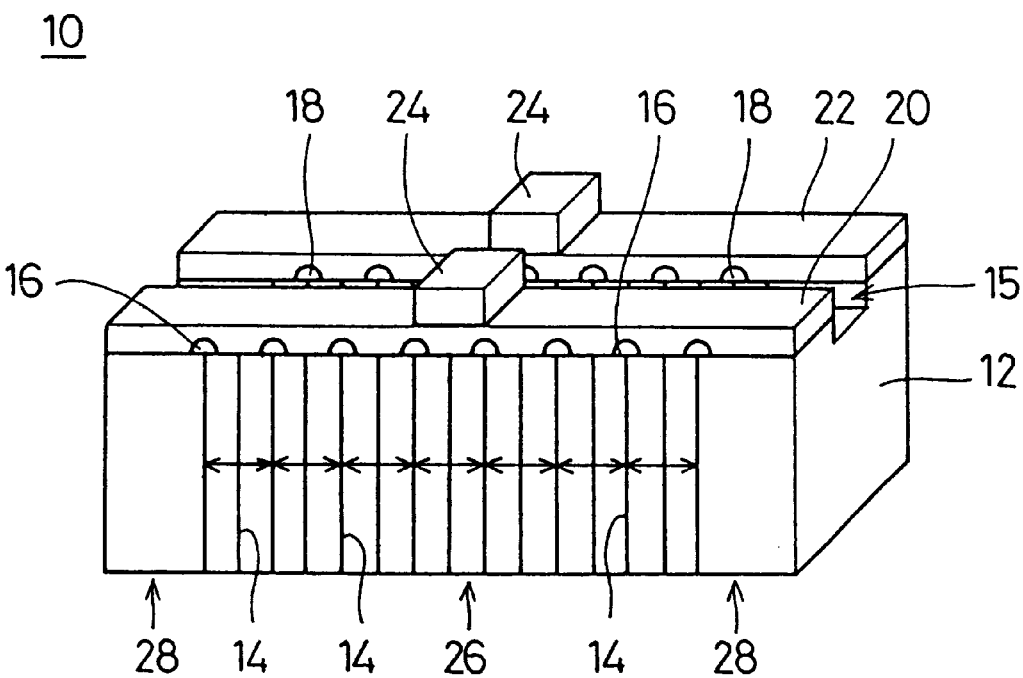
FIG. 2 is a view showing the structure of the piezoelectric resonator shown in FIG. 1.

FIG. 1 is a perspective view of a piezoelectric resonator according to a preferred embodiment of the present invention. FIG. 2 shows the internal structure of the piezoelectric resonator. The piezoelectric resonator 10 includes a base member 12 having, for example, a cubic shape although other shapes can be used. The base member 12 is made from, for example, a piezoelectric ceramic material. A plurality of internal electrodes 14 are disposed in the base member 12 such that the surfaces of the internal electrodes 14 are preferably substantially perpendicular to the longitudinal direction of the base member 12. The base member 12 is polarized in the longitudinal direction such that the directions of polarization of each electrode 14 is opposite to directions of polarization of the adjacent electrodes 14 located on both sides of the electrode 14 as seen in FIG. 2.

Figure 3:
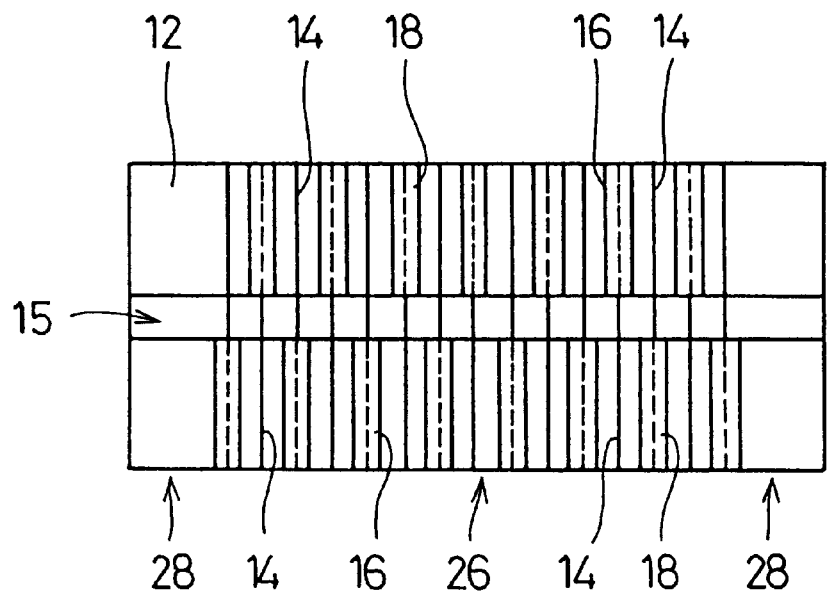
FIG. 3 is a plan view indicating a condition in which insulating film is disposed on a base member used in the piezoelectric resonator shown in FIG. 1.

On one side surface of the base member 12, a groove 15 preferably extends in the longitudinal direction of the base member 12. The groove 15 is preferably formed at the approximate center of the width direction of the base member 12 to divide the one side surface into two sections. On the one side surface divided by the groove 15, a first insulating film 16 and a second insulating film 18 are provided as shown in FIG. 3. On one section made by dividing the one side surface of the base member 12 by the groove 15, the exposed portion of every other internal electrode 14 is covered by the first insulating film 16. On the other section, the exposed portion of every other internal electrode 14 which is not covered by the first insulating film 16 is covered by the second insulating film 18. The two opposite ends of the base member 12 are preferably not polarized.

At portions where the first insulating film 16 and the second insulating film 18 are located, namely, at both sides of the groove 15, external electrodes 20 and 22 are provided. Therefore, the external electrode 20 is connected to internal electrodes 14 which are not covered by the first insulating film 16, and the external electrode 22 is connected to internal electrodes 14 which are not covered by the second insulating film 18. In other words, adjacent internal electrodes 14 are connected to the external electrode 20 and the external electrode 22, respectively. At the approximate centers of the external electrodes 20 and 22 in the longitudinal direction, support members 24 are preferably provided, respectively, such that they are electrically conductive. The support members 24 may be made from an electrically conductive material. Electrical conductivity may be added to the support members 24 by providing an electrode film on a surface of an insulating material constituting the support members.

At both sides of the groove 15, the first insulating film 16 and the second insulating film 18 cover the internal electrodes 14, and the external electrodes 20 and 22 are disposed on the first and second insulating film.

It is not absolutely necessary for the groove 15 to be formed. Electrodes may be formed, for example, such that, on one side surface of the base member 12, the internal electrodes 14 are alternately covered at their exposed portions by insulating film 16 and 18 at both ends of the base member 12 in the width direction and two rows of external electrodes 20 and 22 are formed to extend along in the longitudinal direction of the base member 12. In this case, although the base member 12 is not provided with a groove, adjacent internal electrodes 14 are connected to the external electrodes 20 and 22, respectively.

The piezoelectric resonator 10 uses the external electrodes 20 and 22 as input and output electrodes. At portions except for two opposite ends of the base member 12, since an electric field is applied to adjacent internal electrodes 14, the base member 12 is preferably piezoelectrically active. At the two opposite ends of the base member 12, since the base member is preferably not polarized and/or an electric field is not applied due to lack of electrodes formed at both ends, the base member is preferably piezoelectrically inactive. Therefore, an active section 26 for input signals is preferably formed at the approximate center of the base member 12, and inactive sections 28 for input signals are preferably formed at the two opposite ends of the base member 12. The inactive sections 28 do not generate a driving force when receiving input signals. If an electric field is applied to internal electrodes, when the portion between the internal electrodes is not polarized, the portion is inactive. A structure may also be used in which an electric field is not applied to polarized piezoelectric layers so as to form the inactive section.

Figure 4:
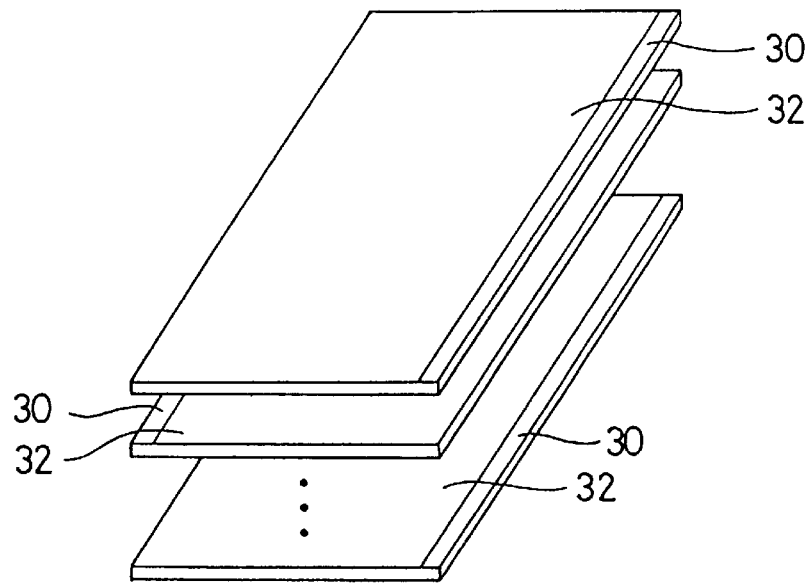
FIG. 4 is a perspective view indicating how ceramic green sheets are laminated in order to produce the piezoelectric resonator shown in FIG. 1.
Figure 5:
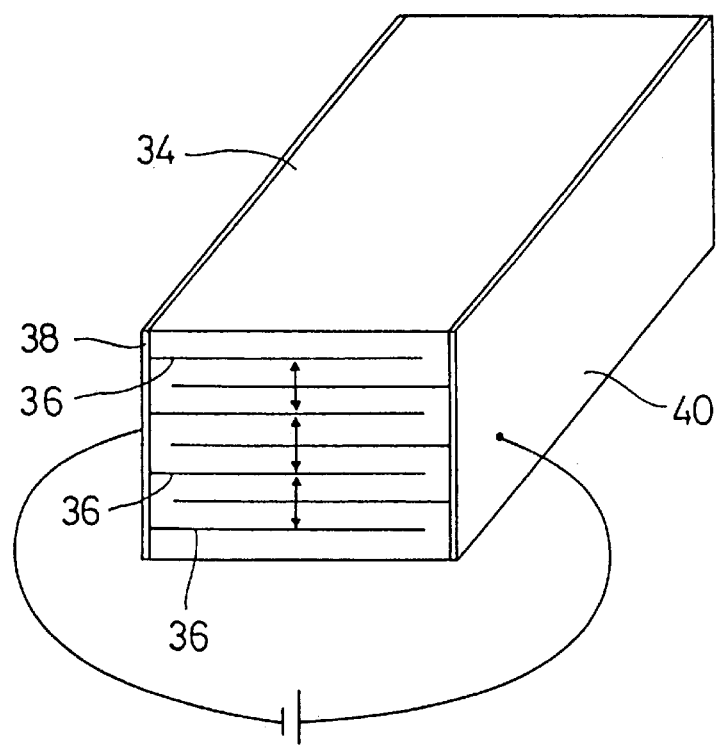
FIG. 5 is a view showing a laminated base formed by the ceramic green sheets shown in FIG. 4.

In a preferred method of making the piezoelectric resonator 10, green sheets 30 made from piezoelectric ceramic are first prepared as shown in FIG. 4. On one surface of each green sheet 30, electrically conductive paste including, for example, silver, palladium, and an organic binder, is applied to form an electrically conductive paste layer 32 over almost the entire area of each green sheet 30 excluding an end portion. A plurality of green sheets 30 are laminated such that the end portions where the electrically conductive paste layers 32 are not formed on the green sheets are placed alternately in opposite directions. The laminated member with electrically conductive paste applied to opposite side surfaces is baked to form a laminated base 34 shown in FIG. 5.

The laminated base 34 has a plurality of internal electrodes 36, which have been made by baking the electrically conductive layers 32. Polarizing electrodes 38 and 40 formed on opposite surfaces are connected to every other internal electrode 36, respectively, since the internal electrodes 36 are alternately exposed on opposite surfaces of the laminated base 34. When a DC voltage is applied to the polarizing electrodes 38 and 40, the laminated base 34 is polarized. Inside the laminated base 34, a high DC electric field is alternately applied between adjacent internal electrodes 36 in opposite directions. Therefore, the laminated base 34 is polarized in opposite directions at both sides of each of the internal electrodes 36 as shown by arrows in FIG. 5.

Figure 6:
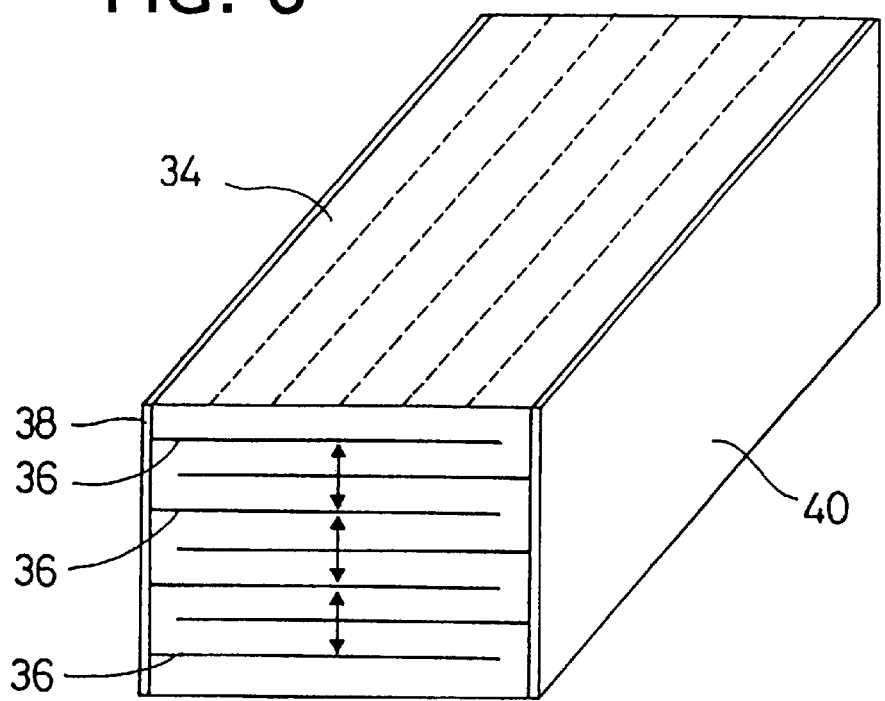
FIG. 6 is a view showing portions where the laminated base shown in FIG. 5 is cut.
Figure 7:
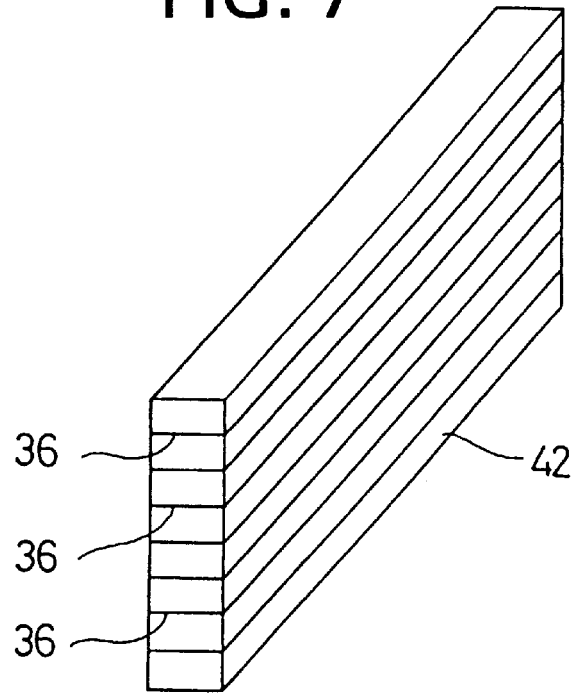
FIG. 7 is a view showing a laminated member made by cutting the laminated base shown in FIG. 6.
Figure 8:
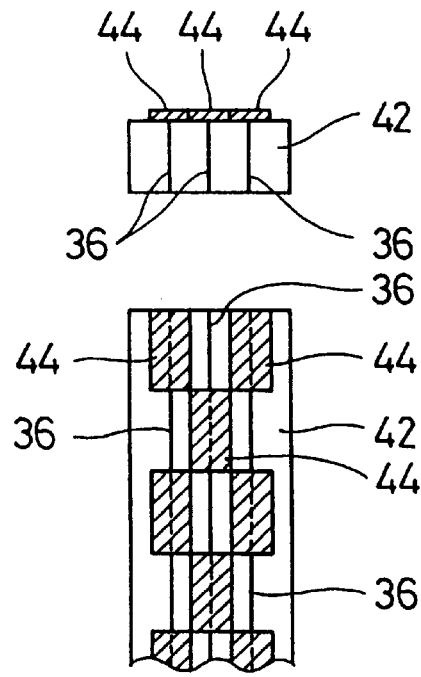
FIG. 8 is a view showing a plan and side view of the laminated member shown in FIG. 7 to which insulating film is applied.
Figure 9:
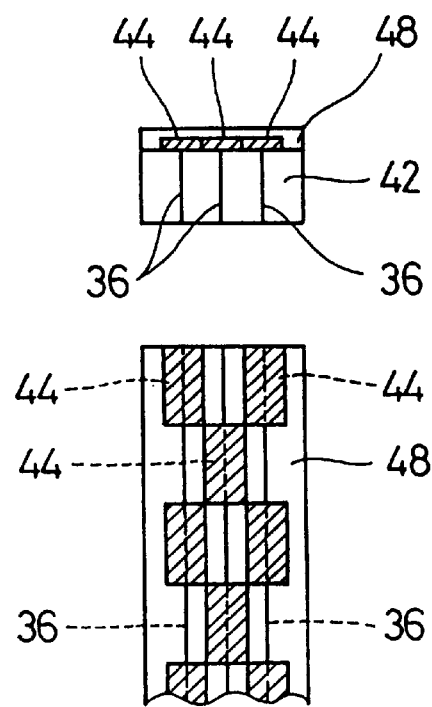
FIG. 9 is a view showing a plan and side view of the laminated member shown in FIG. 8 to which an external electrode is applied.

The laminated base 34 is preferably surface-ground to the desired thickness since the antiresonant frequency of the resonator is determined by the thickness of the laminated base 34. The laminated base 34 is cut by a dicing machine along dotted lines shown in FIG. 6 such that the cutting planes are substantially perpendicular to the plurality of internal electrodes 36. Then, a laminated member 42 in which the ends of the internal electrodes 36 are exposed is obtained as shown in FIG. 7. Insulating film 44 is applied to one surface of the laminated member 42 preferably in a check pattern as shown in FIG. 8. As compared with FIG. 7, FIG. 8 is a simplified figure and the number of laminated layers is reduced for simplicity. One row of the insulating film 44 covers alternate internal electrodes 36. The adjacent rows of the insulating film 44 cover the other alternate internal electrodes 36. An external electrode 48 is formed preferably by sputtering on the surface where the insulating film 44 is formed on the laminated member 42 as shown in FIG. 9.

Figure 10:
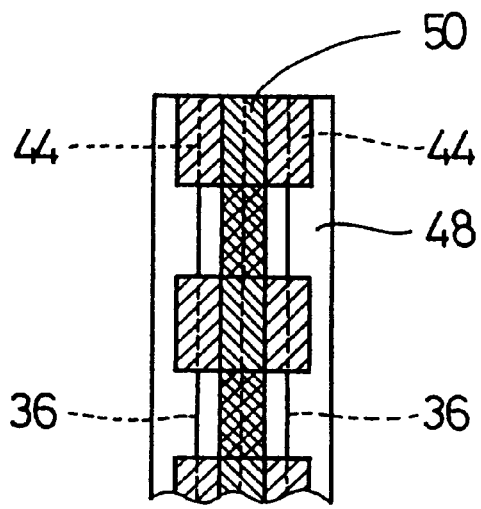
FIG. 10 is a view showing a plan and side view of the laminated member shown in FIG. 9 in which a support member is disposed on the external electrode.
Figure 11:
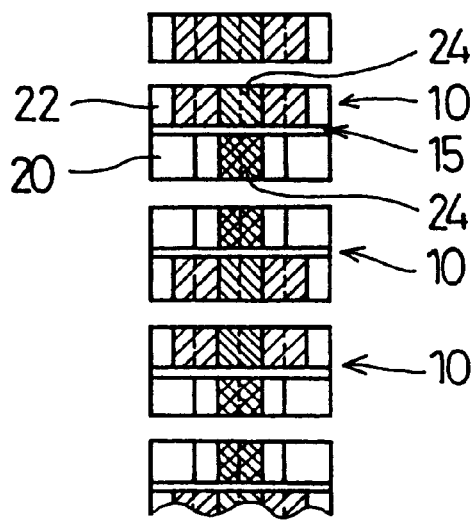
FIG. 11 is a view showing a process for manufacturing a piezoelectric resonator, in which grooves are formed on the laminated member shown in FIG. 9 and the laminated member is cut.

A support member 50 made from an electrically conductive material is preferably formed at the approximate center of the laminated member 42 such that the support member is substantially parallel to the internal electrodes 36 as shown in FIG. 10. Grooves 15 are preferably formed between adjacent rows of insulating film 44 formed in a check pattern, such that the grooves are substantially perpendicular to the surfaces of the internal electrodes 36 as shown in FIG. 11. The laminated member 42 is cut by the is grooves 15 to form the piezoelectric resonator shown in FIG. 1.

When a signal is applied to the external electrodes 20 and 22 in the piezoelectric resonator 10, since voltages are applied in directions which are opposite to the polarization of the piezoelectric layers in the active section 26, the piezoelectric layers expand and contract as an integral unit in the same direction. Therefore, the piezoelectric resonator 10 vibrates in the longitudinal direction in a basic mode with the approximate center of the base member 12 serving as a node.

In the piezoelectric resonator 10, the polarization direction of the active section 26, the applied electric field direction due to a signal, and the direction of vibration in the active section 26 are all the same. In other words, the piezoelectric resonator 10 is a stiffened type resonator. The stiffened piezoelectric resonator 10 has a larger electromagnetic coupling coefficient than an unstiffened piezoelectric resonator, in which the direction of vibration differs from the direction of polarization and electric field. Therefore, the piezoelectric resonator 10 has a larger frequency difference ΔF between the resonant frequency and the antiresonant frequency than the conventional piezoelectric resonator. This means that the piezoelectric resonator 10 obtains wide-frequency-band characteristics.

Figure 12:
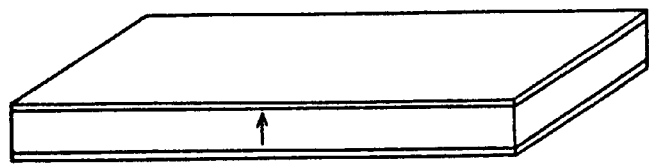
FIG. 12 is a perspective view of an unstiffened piezoelectric resonator which vibrates in the longitudinal direction, shown for comparison.
Figure 13:
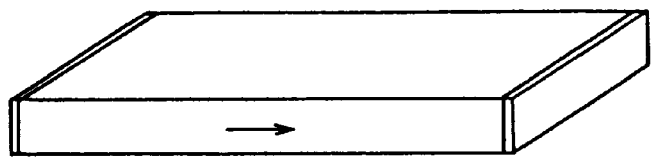
FIG. 13 is a perspective view of a stiffened piezoelectric resonator which vibrates in the longitudinal direction.
Figure 14:
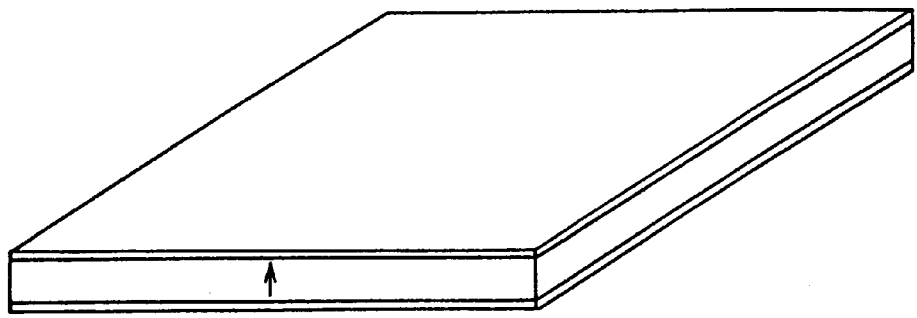
FIG. 14 is a perspective view of an unstiffened piezoelectric resonator which vibrates in the plane direction (square-type vibration), shown for comparison.

To measure differences between stiffened and unstiffened piezoelectric resonators, piezoelectric resonators shown in FIGS. 12, 13, and 14 were made. The piezoelectric resonator shown in FIG. 12 was made by providing electrodes on two opposite major surfaces of a piezoelectric substrate measuring approximately 4.0 mm by 1.0 mm by 0.38 mm. This piezoelectric resonator was polarized in the thickness direction and vibrated in the longitudinal direction when a signal was applied to the electrodes. The piezoelectric resonator shown in FIG. 13 had the same dimensions as the piezoelectric resonator shown in FIG. 12. Electrodes were disposed on two opposite side edge surfaces of a piezoelectric substrate. The piezoelectric resonator was polarized in the longitudinal direction and vibrated in the longitudinal direction when a signal was applied to the electrodes. The piezoelectric resonator shown in FIG. 14 was made by providing electrodes on two opposite major surfaces of a piezoelectric substrate measuring approximately 4.7 mm by 4.7 mm by 0.38 mm. This piezoelectric resonator was polarized in the thickness direction and vibrated in the plane direction when a signal was applied to the electrodes. The piezoelectric resonators shown in FIGS. 12 and 14 were an unstiffened type and the piezoelectric resonator shown in FIG. 13 was a stiffened type.

The resonant frequency Fr and the electromechanical coupling coefficient K of each of these piezoelectric resonators were measured and the results are shown in Tables 1, 2, and 3. Table 1 indicates the measured results of the piezoelectric resonator shown in FIG. 12. Table 2 indicates the measured results of the piezoelectric resonator shown in FIG. 13. Table 3 indicates the measured results of the piezoelectric resonator shown in FIG. 14.

TABLE 1

|  | Basic longitudinal vibration | longitudinal triple-wave vibration | Width-mode vibration |
| --- | --- | --- | --- |
| Resonant frequency (Mhz) | 0.460 | 1.32 | 1.95 |
| Electro-mechanical coupling coefficient (%) | 18.9 | 3.9 | 25.2 |

TABLE 2

|  | Basic longitudinal vibration | longitudinal triple-wave vibration | Width-mode vibration |
| --- | --- | --- | --- |
| Resonant frequency (Mhz) | 0.455 | 1.44 | 1.96 |
| Electro-mechanical coupling coefficient (%) | 42.9 | 12.2 | 4.0 |

TABLE 3

|  | Basic longitudinal vibration | Square-type triple-wave vibration | Thickness-mode vibration |
| --- | --- | --- | --- |
| Resonant frequency (Mhz) | 0.458 | 1.25 | 5.65 |
| Electro-mechanical coupling coefficient (%) | 35.0 | 11.5 | 23.3 |

It is understood from the measurement data that a stiffened piezoelectric resonator has a larger electromagnetic coupling coefficient K than an unstiffened piezoelectric resonator, and therefore has a larger frequency difference ΔF between the resonant frequency and the antiresonant frequency. The largest spurious vibration in a stiffened piezoelectric resonator is of longitudinal triple-wave type and the electromagnetic coupling coefficient K is 12.2% during vibration. During width-mode vibration, which is different from basic vibration, the electromagnetic coupling coefficient K is about 4.0%. In contrast, the electromagnetic coupling coefficient K during width-mode vibration is 25.2% in an unstiffened longitudinal-vibration piezoelectric resonator. In an unstiffened square-type vibration piezoelectric resonator, the electromagnetic coupling coefficient K is as large as 23.3% during thickness-mode vibration. Therefore, it is understood that a stiffened piezoelectric resonator has smaller spurious vibrations than an unstiffened piezoelectric resonator.

In the piezoelectric resonator 10, the inactive section 28 is preferably disposed at both ends of the base member 12. The inactive section 28 is preferably-changed to adjust the resonant frequency and the difference ΔF between the resonant frequency and the antiresonant frequency. For example, by grinding the end surfaces in the longitudinal direction of the base member 12 or by adding mass to the inactive section, the band width of the piezoelectric resonator 10 can be easily adjusted.

In the piezoelectric resonator 10, the capacitance of the resonator can be easily adjusted by, for example, changing the number of layers in the active section 26. In the active section 26, piezoelectric layers and internal electrodes 14 are alternately stacked and electrically connected in parallel. When the number of layers is changed it with the total thickness of the active section 26 remaining constant, the following relationship is satisfied since the thickness of one layer is inversely proportional to the number of layers.

Capacitance of resonator∝(the number of layers in active section/thickness of a layer)∝(the number of layers in active section)$^2$ wherein ∝ is defined as "is proportional to."

The capacitance of the resonator is proportional to the square of the number of layers in the active section 26. Therefore, the number of layers in the active section 26 is changed to adjust the capacitance of the piezoelectric resonator 10. This means that the piezoelectric resonator 10 has a large degree of flexibility and freedom in capacitance design. Therefore, it is easy to achieve impedance matching with an external circuit when the piezoelectric resonator 10 is mounted on a circuit board because of the ability to easily and accurately achieve a desired capacitance.

In another example, electrically conductive paste including, for example, silver, palladium, and an organic binder, was applied to one surface of each green sheet 30 made from piezoelectric ceramic. A plurality of such green sheets were stacked alternately and baked integrally at about 1200° C. to form a laminated base 34 measuring approximately 20 mm by 30 mm by 3.9 mm. Polarizing electrodes 38 and 40 were formed by sputtering. A high DC electric field was applied between adjacent internal electrodes 36 to polarize the laminated base such that the directions of polarization in adjacent piezoelectric layers were alternately opposed. The thickness of the laminated base 34 was changed. The laminated base 34 was cut to form a laminated member 42 measuring approximately 1.5 mm by 30 mm by 3.8 mm. Insulating film 44 was formed in a check pattern on the internal electrodes 36 which were exposed to one surface of the laminated member 42 and a silver electrode was formed on it by sputtering. A support member 50 was disposed on the electrode and a groove 15 was also formed. The resultant block was cut by a dicing machine to obtain a piezoelectric resonator 10 measuring approximately 1.5 mm by 1.5 mm by 3.8 mm.

Figure 15:
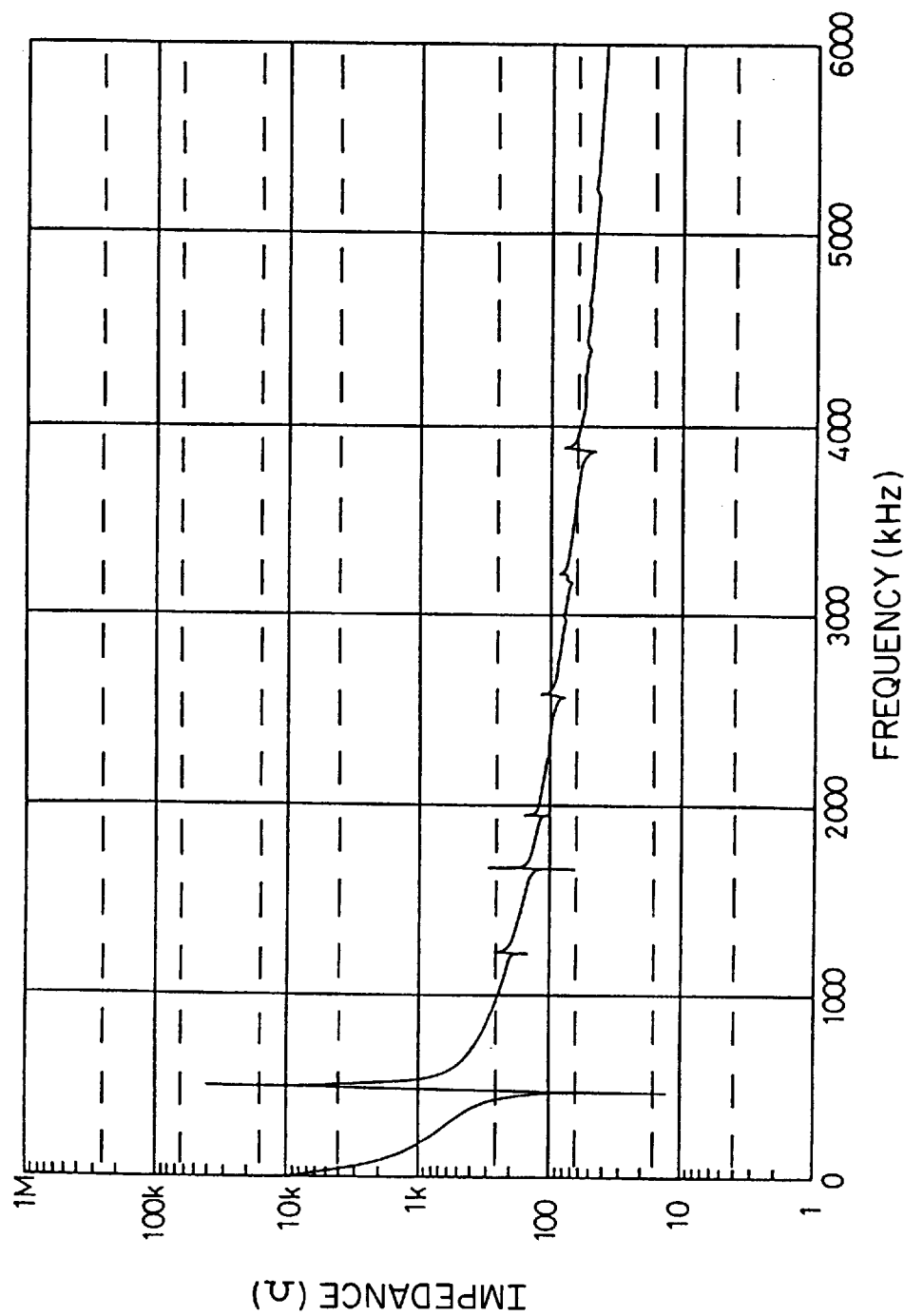
FIG. 15 is a chart showing the relationship between the frequency and the impedance of a piezoelectric resonator according to the preferred embodiments of the present invention.
Figure 16:
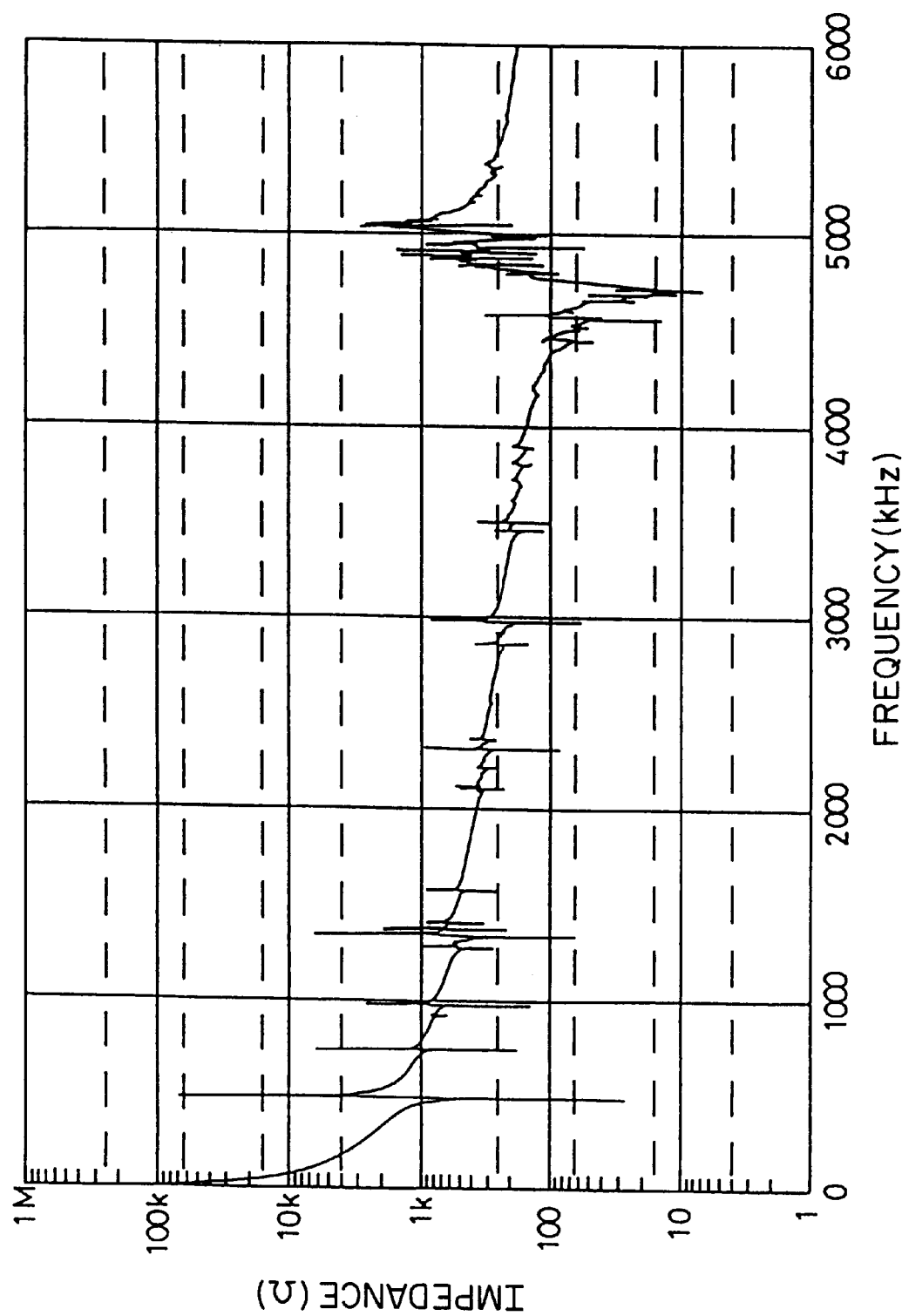
FIG. 16 is a chart showing the relationship between the frequency and the impedance of a conventional piezoelectric resonator.

The piezoelectric resonator 10 had nineteen electrodes 14 in the base member 12, the electrodes 14 being disposed at an almost equal interval of about 0.19 mm. First and second insulating films 16 and 18 were formed so that an electric field is not applied to three piezoelectric layers disposed at both ends of the base member 12. An active section 26 included 14 piezoelectric layers disposed at the center of the base member 12, and an inactive section 28 had three piezoelectric layers at each of the two opposite ends. The piezoelectric resonator 10 had a capacitance of 830 pF and the frequency characteristics shown in FIG. 15. For comparison, the frequency characteristics of a square-type vibration piezoelectric resonator is shown in FIG. 16. It is found from FIGS. 15 and 16 that the piezoelectric resonator 10 according to the preferred embodiments of the present invention has much less spurious vibration than the square-shaped piezoelectric resonator.

Figure 17:
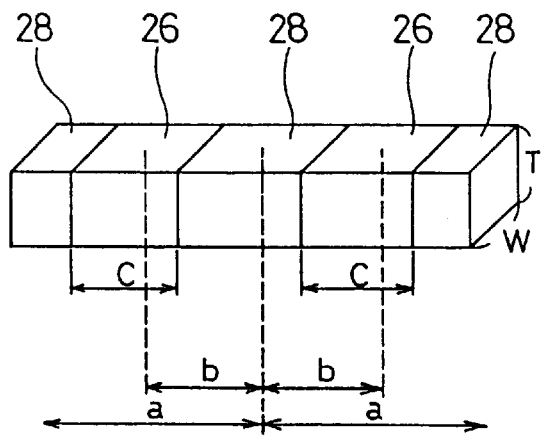
FIG. 17 is a view of a piezoelectric resonator in which the distribution of an active section and inactive sections is changed in a base member.
Figure 18:
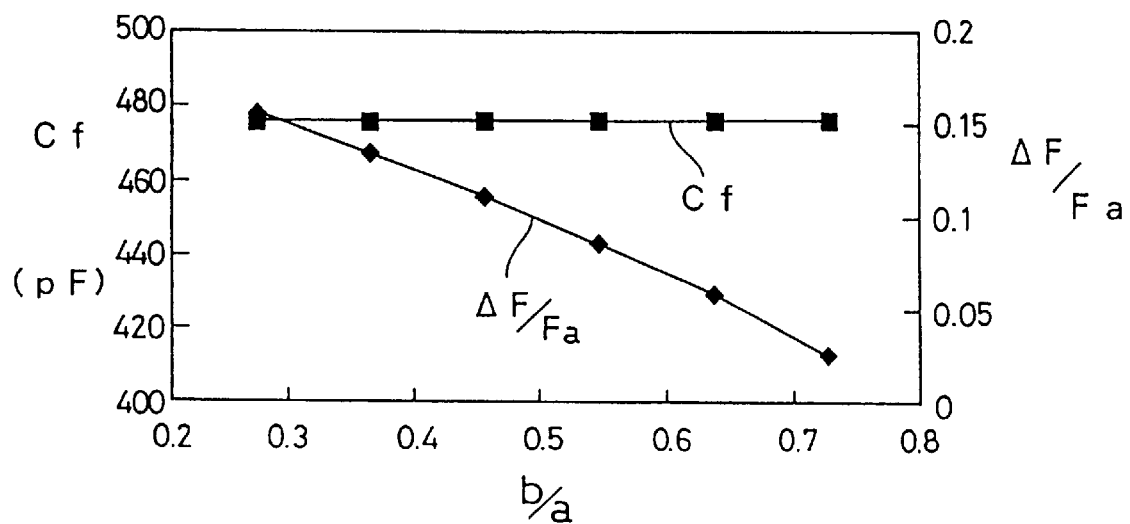
FIG. 18 is a chart indicating the relationship between the distribution of an active section and capacitance, and ΔF/Fa.

Depending on the positions where active sections 26 and inactive sections 28 are disposed, the frequency difference ΔF between the resonant frequency and the antiresonant frequency changes. Inactive sections 28 can be formed, for example as shown in FIG. 17, at the two opposite ends and the approximate center of the base member 12. The finite element method was used to calculate changes in capacitance Cf and frequency difference ΔF in the piezoelectric resonator in a case in which the positions where active sections 26 were formed change, where "a" indicates the distance between the center and an end of the piezoelectric resonator 10, "b" indicates the distance between the center and the center of gravity of an active section 26, "c" indicates the length of the active sections 26, W indicates the width of the base member 12, and T indicates the thickness of the base member 12. FIG. 18 shows the relationship between b/a, and the ratio of ΔF to the antiresonant frequency Fa, ΔF/Fa, and the capacitance Cf with "a" being approximately equal to about 1.89 mm, W and T equal to about 0.8 mm, "c" equal to about 0.86 mm, and b/a changing. From FIG. 18, it is found that the capacitance Cf does not change irrespective of the positions where the active sections 26 were formed. In contrast, it was also found that ΔF decreases as the active sections 26 are disposed closer to the two opposite ends of the base member 12.

The frequency difference ΔF can be changed in the piezoelectric resonator 10 by changing the ratio of thee active sections 26 to the inactive sections 28. With a changing active-section ratio, which is a ratio of the length of the active section 26 to a total length of the base member 12 in the piezoelectric resonator 10 shown in FIGS. 1 and 2, the resonant frequency Fr, the antiresonant frequency Fa, the frequency difference ΔF, and its rate of change were measured and are indicated in Table 4 and FIG. 19.

TABLE 4

| Active-section length (mm) | Active-section ratio (%) | Fr (Khz) | Fa (Khz) | ΔF (Khz) | ΔF change rate (%) |
|---|---|---|---|---|---|
| 1.80 | 100.0 | 1047.4 | 1163.4 | 115.9 | 0.0 |
| 1.70 | 94.4 | 1042.4 | 1163.4 | 120.9 | 4.3 |
| 1.60 | 88.9 | 1038.6 | 1163.4 | 124.8 | 7.6 |
| 1.53 | 85.0 | 1036.6 | 1163.4 | 126.8 | 9.4 |
| 1.50 | 83.3 | 1035.9 | 1163.4 | 127.5 | 9.9 |
| 1.40 | 77.8 | 1034.5 | 1163.4 | 128.9 | 11.2 |
| 1.35 | 75.0 | 1034.3 | 1163.4 | 129.1 | 11.4 |
| 1.30 | 72.2 | 1034.3 | 1163.4 | 129.0 | 11.3 |
| 1.20 | 66.7 | 1035.5 | 1163.4 | 127.9 | 10.3 |
| 1.17 | 65.0 | 1036.1 | 1163.4 | 127.2 | 9.7 |
| 1.10 | 61.1 | 1038.1 | 1163.4 | 125.3 | 8.1 |
| 1.00 | 55.6 | 1042.0 | 1163.4 | 121.4 | 4.7 |
| 0.90 | 50.0 | 1047.4 | 1163.4 | 115.9 | 0.0 |
| 0.80 | 44.4 | 1054.3 | 1163.4 | 109.1 | −5.9 |
| 0.70 | 38.9 | 1062.7 | 1163.4 | 100.6 | −13.2 |
| 0.60 | 33.3 | 1072.7 | 1163.4 | 90.7 | −21.8 |
| 0.50 | 27.8 | 1084.2 | 1163.4 | 79.1 | −31.7 |
| 0.40 | 22.2 | 1097.3 | 1163.4 | 66.1 | −43.0 |
| 0.30 | 16.7 | 1111.9 | 1163.4 | 51.5 | −55.6 |
| 0.20 | 11.1 | 1127.9 | 1163.4 | 35.5 | −69.4 |
| 0.10 | 5.6 | 1145.2 | 1163.4 | 18.2 | −84.3 |

Figure 19:
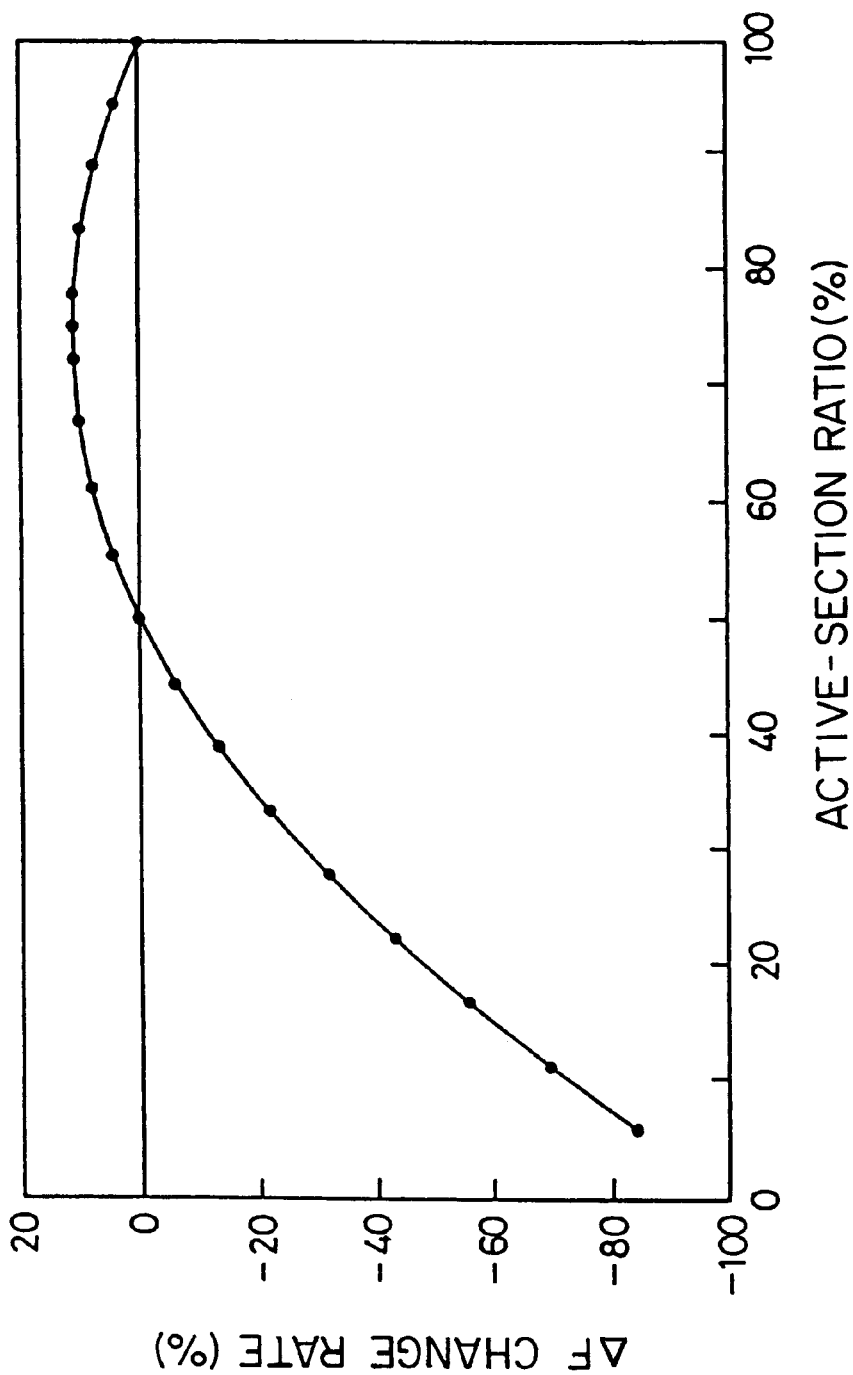
FIG. 19 is a chart showing the relationship between an active-section ratio and ΔF.

FIG. 19 shows the relationship between the active-section ratio and change in ΔF under the condition in which ΔF is set to 100% when the active-section ratio is 100%, namely when an inactive section does not exist. It is seen from FIG. 19 that ΔF is large at an active-section ratio of 65% to 85% with the peak ΔF being obtained at an active-section ratio of 75%. The peak value is larger by about 10% than the ΔF obtained when the active-section ratio is 100%, in other words, when an inactive section does not exist. The same ΔF is obtained at active-section ratios of 50% and 100%. Therefore, to obtain a piezoelectric resonator having a large ΔF, the active-section ratio should be set to about 50% or more.

In the piezoelectric resonator 10, when 14 piezoelectric layers constituted the active section 26 among 20 layers, the capacitance was 830 pF. In contrast, when the active-section ratio was set to 100%, which means that only one piezoelectric layer was used, in other words, when electrodes were formed at both end surfaces of the base member 12, with the same material and the same dimensions, the capacitance was 3.0 pF. When all of the 20 piezoelectric layers constituted the active section 26, the capacitance was 1185.6 pF. By changing the number of piezoelectric layers in the active section 26 of the base member in the piezoelectric resonator 10, the capacitance can be easily changed within a range of about 400-times difference between the minimum and maximum. Therefore, by changing the lamination structure of the piezoelectric resonator 10, the capacitance can be selected from a wide range which provides a large degree of flexibility and freedom in capacitance design.

Figure 20:
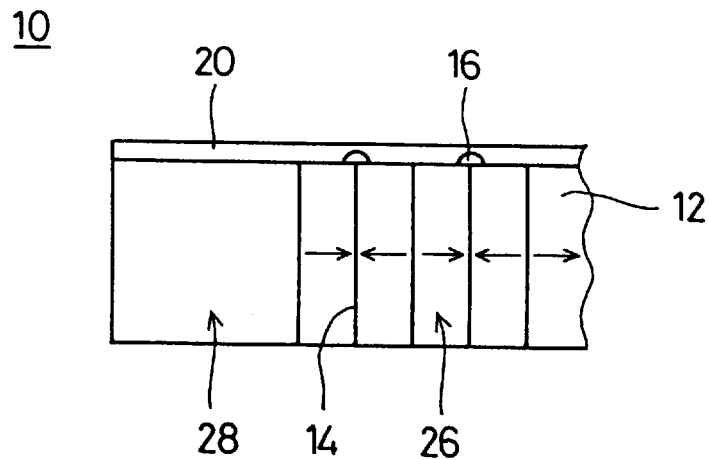
FIG. 20 is a view showing a modified inactive section of a piezoelectric resonator.
Figure 21:
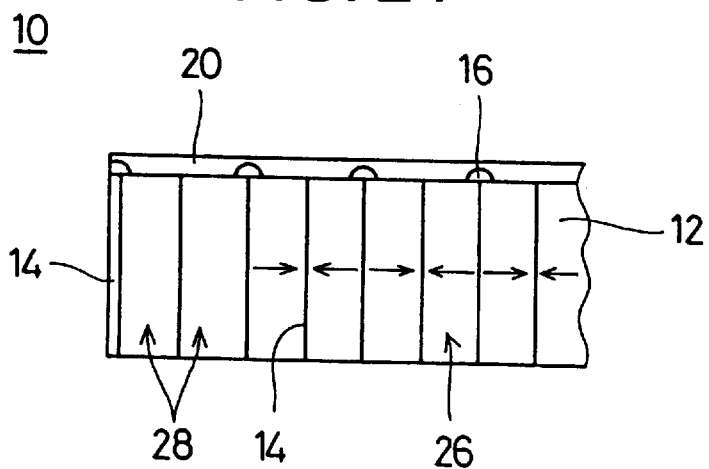
FIG. 21 is a view showing another modified inactive section of a piezoelectric resonator.
Figure 22:
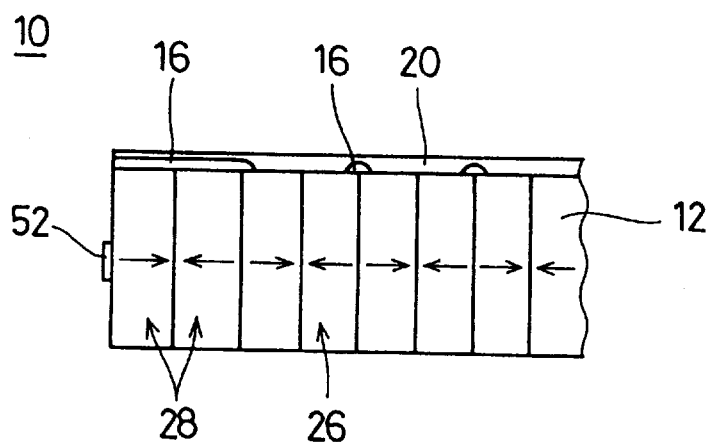
FIG. 22 is a view showing still another modified inactive section of a piezoelectric resonator.

An inactive section 28 may be formed such that an electric field is not applied by not forming an electrode at an end of the base member 12 as shown in FIG. 20. The end of the base member 12 may be polarized or may be not polarized. As shown in FIG. 21, only the end of the base member 12 may be not polarized. In this case, even if an electric field is applied between the electrodes 14, a portion that is not polarized is piezoelectrically inactive. The structure may be formed such that the entire base member 12 is completely polarized and an electric field is not applied to the internal electrodes 14 due to insulating films 16 and 18. In other words, only when a piezoelectric layer is polarized and an electric field is applied, the layer becomes piezoelectrically active, otherwise it is inactive. In the configuration shown in FIGS. 21 and 22, capacitors are also formed in the inactive section, and the capacitance can be increased. A small electrode 52 may be formed on an end surface of the base member 12 as shown in FIG. 22 in order to adjust the frequency or to connect to an external circuit.

Figure 23:
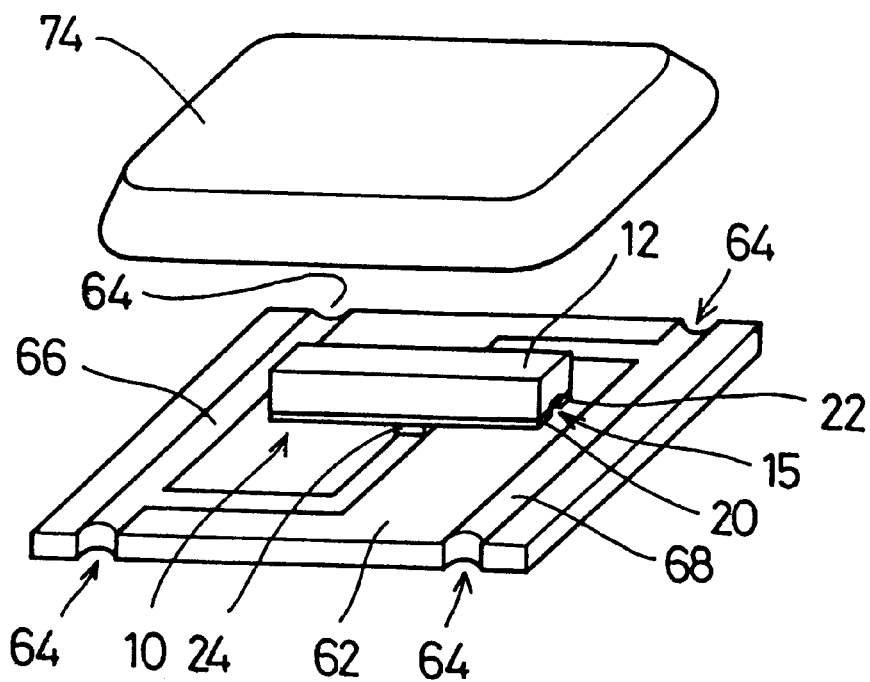
FIG. 23 is an exploded perspective view of an electronic component using the above-described piezoelectric resonator.

Using such a piezoelectric resonator 10, electronic components such as oscillators and discriminators are produced. FIG. 23 is a perspective view of an electronic component 60. The electronic component 60 includes an insulating substrate 62. At opposing end portions of the insulating substrate 62, two indentations 64 are preferably formed, respectively. On one surface of the insulating substrate 62, two pattern electrodes 66 and 68 are disposed. One pattern electrode 66 is formed between opposing indentations and extends in a substantially L-shaped manner from a point near one end toward the center of the insulating substrate 62. The other pattern electrode 68 is formed between opposing indentations 64 and extends a substantially L shape arrangement from a point near the other end toward the center of the insulating substrate 62. At the approximate center of the insulating substrate 62, the two pattern electrodes 66 and 68 are disposed opposite to each other and spaced apart. The pattern electrodes 66 and 68 are formed such that they are routed in a roundabout fashion from the ends of the insulating substrate 62 to the opposite surface.

Figure 24:
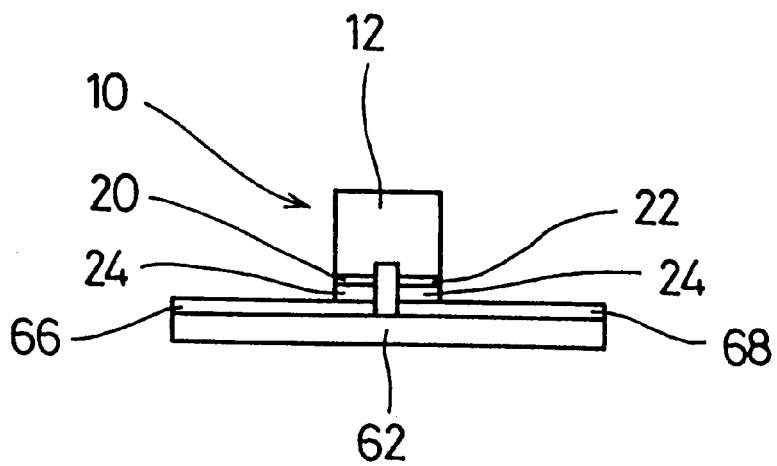
FIG. 24 is a side view showing how the piezoelectric resonator is mounted in the electronic component shown in FIG. 23.

At ends of the pattern electrodes 66 and 68 disposed at the center of the insulating substrate 62, a support member 24 for the piezoelectric resonator 10 is connected preferably by electrically conductive adhesive as shown in FIG. 24. The external electrodes 20 and 22 of the piezoelectric resonator 10 are thereby secured to the insulating substrate 62 and electrically connected to the pattern electrodes 66 and 68.

A metal cap 74 is preferably placed on the insulating substrate 62 to complete the electronic component 60. To prevent the metal cap 74 from being short-circuited to the pattern electrodes 66 and 68, insulating resin is preferably applied to the insulating substrate 62 and the pattern electrodes 66 and 68 in advance. The electronic component 60 uses the pattern electrodes 66 and 68, which are formed such that they are routed to the rear surface from ends of the insulating substrate 62, as input and output terminals for connecting to external circuits.

Since the support member 24 provided at the approximate center of the base member 12 supports the piezoelectric resonator 10 in this electronic component 60, the ends of the piezoelectric resonator 10 are disposed separately from the insulating substrate 62 and thus the vibration of the piezoelectric resonator 10 is not inhibited. The approximate center of the piezoelectric resonator 10, which-serves as a node, is preferably secured by the support member 24, and the external electrodes 20 and 22 are electrically connected to the pattern electrodes 66 and 68. Since the support member 24 is formed on the piezoelectric resonator 10 in advance, the node of the piezoelectric resonator 10 is accurately positioned. Therefore, as compared with a case in which the piezoelectric resonator is placed on protruded support members formed on the pattern electrodes 66 and 68, the node is more accurately supported. The vibration of the piezoelectric resonator 10 is prevented from leaking and superior characteristics are achieved. The electronic component 60 is manufactured at low cost because leads are not required to connect the external electrodes 20 and 22 of the piezoelectric resonator 10 to the pattern electrodes 66 and 68.

The electronic component 60 is mounted on a circuit board together with IC chips and other components to form an oscillator or a discriminator. Since the electronic component 60 is sealed and protected by the metal cap 74, it can be used as a chip-type surface-mountable component which can be mounted by reflow soldering or other suitable method.

When the electronic component 60 is used in an oscillator, spurious vibrations are suppressed to a low level and unusual vibration caused by the spurious vibrations are prevented due to the features of the piezoelectric resonator 10 used in the electronic component 60. It is also easy to achieve impedance matching with an external circuit since the capacitance of the piezoelectric resonator 10 can be set to any desired value. Especially when the electronic component is used for an oscillator for voltage-controlled oscillation, a wide frequency range which cannot be obtained conventionally is acquired due to a large ΔF of the resonator.

When the electronic component 60 is used for a discriminator, a wide peak-separation range is provided due to a large ΔF of the resonator. In addition, since the resonator provides a wide capacitance range, it is easy to achieve impedance matching with an external circuit.

Figure 25:
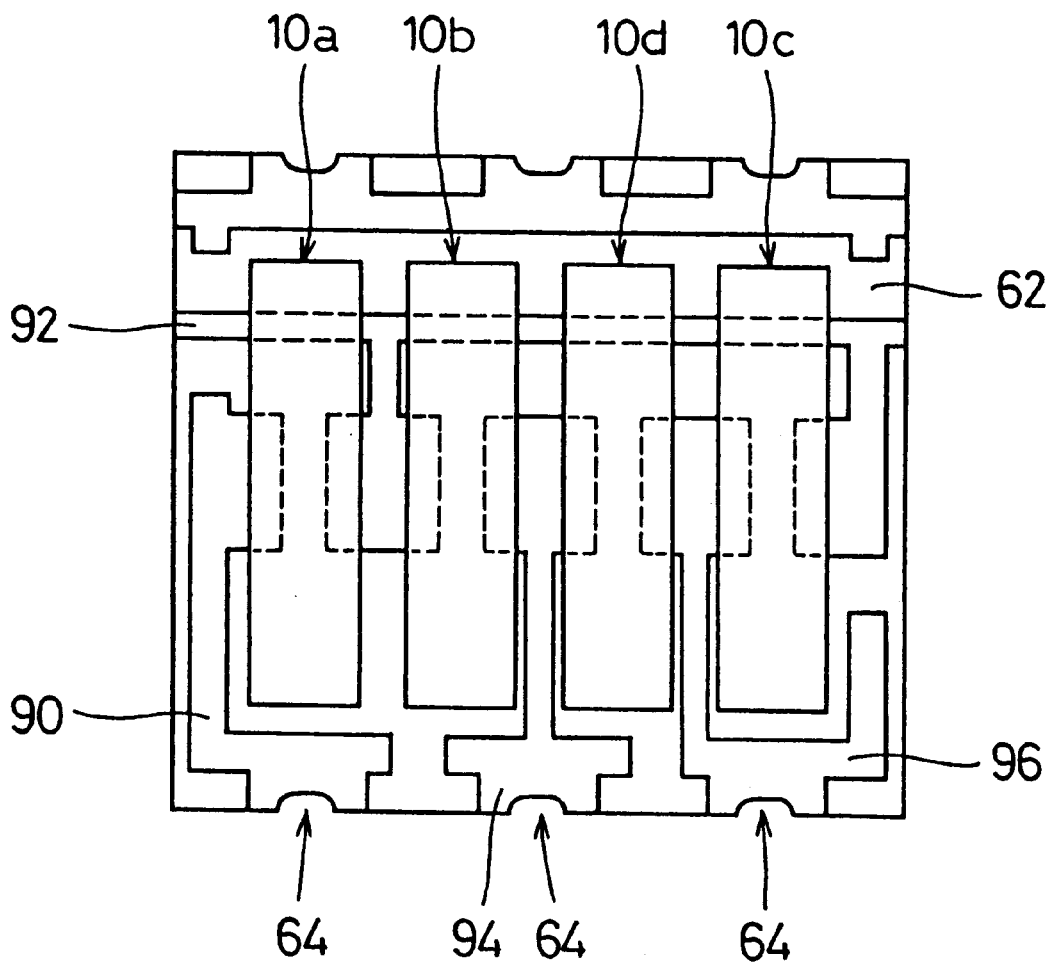
FIG. 25 is a plan of a main section of a ladder filter using the piezoelectric resonators according to the preferred embodiments of the present invention.
Figure 26:
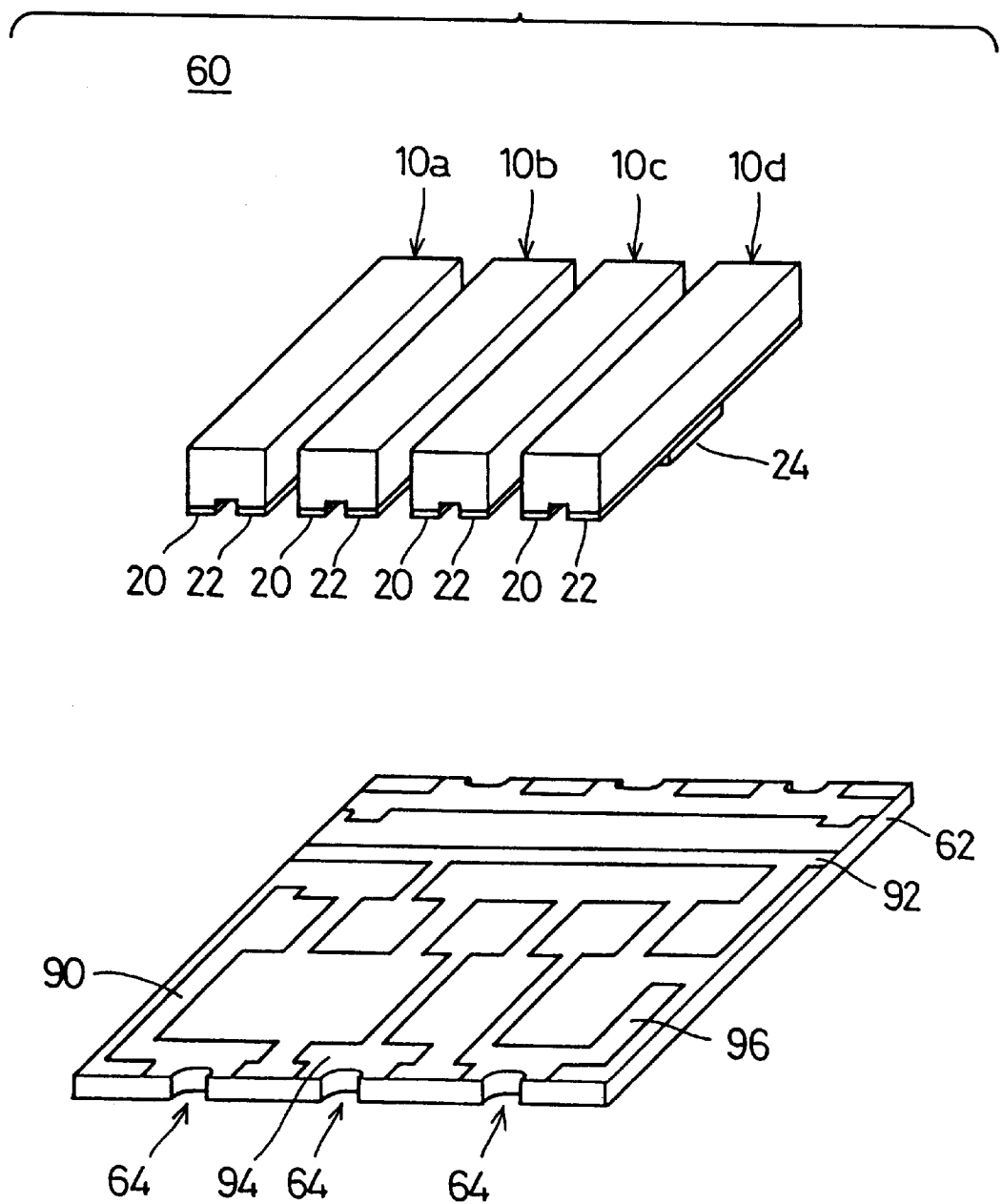
FIG. 26 is an exploded perspective view of the main section of the ladder filter shown in FIG. 25.

A ladder filter can be made using a plurality of the piezoelectric resonators 10. FIG. 25 is a plan view of the main section of a ladder filter having a ladder-shaped circuit. FIG. 26 is an exploded perspective view of the main section. In the electronic component 60 shown in FIGS. 25 and 26, four pattern electrodes 90, 92, 94, and 96 are preferably formed on an insulating substrate 62. Five lands disposed in line at a certain interval are formed on the pattern electrodes 90, 92, 94, and 96. The first land, which is closest to an end of the insulating substrate 62, is formed on the pattern electrode 90, the second and fifth lands are formed on the pattern electrode 92, the third land is formed on the pattern electrode 94, and the fourth land is formed on the pattern electrode 96.

Figure 27:
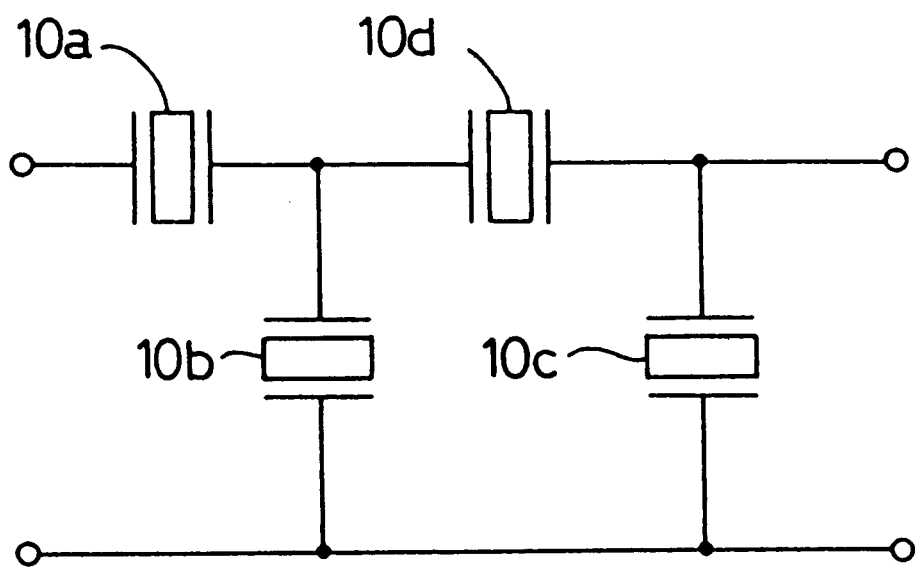
FIG. 27 is an equivalent circuit diagram of the ladder filter shown in FIG. 25.
Figure 28:
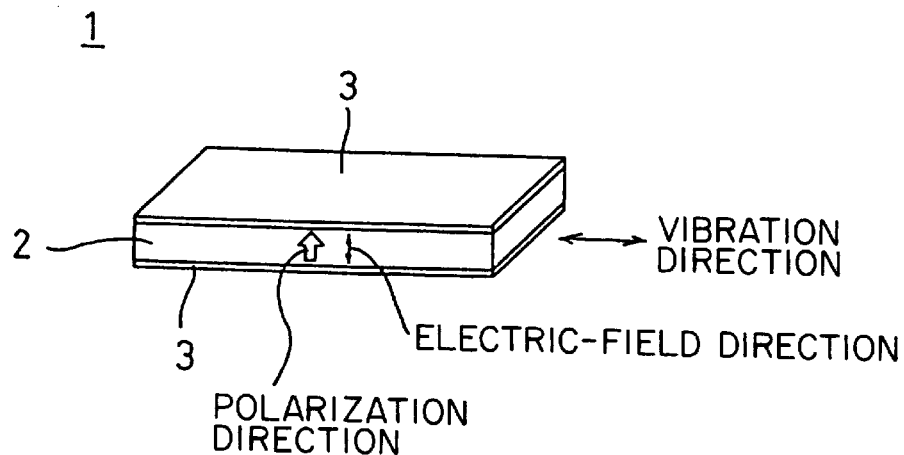
FIG. 28 is a view of a conventional unstiffened piezoelectric resonator.
Figure 29:
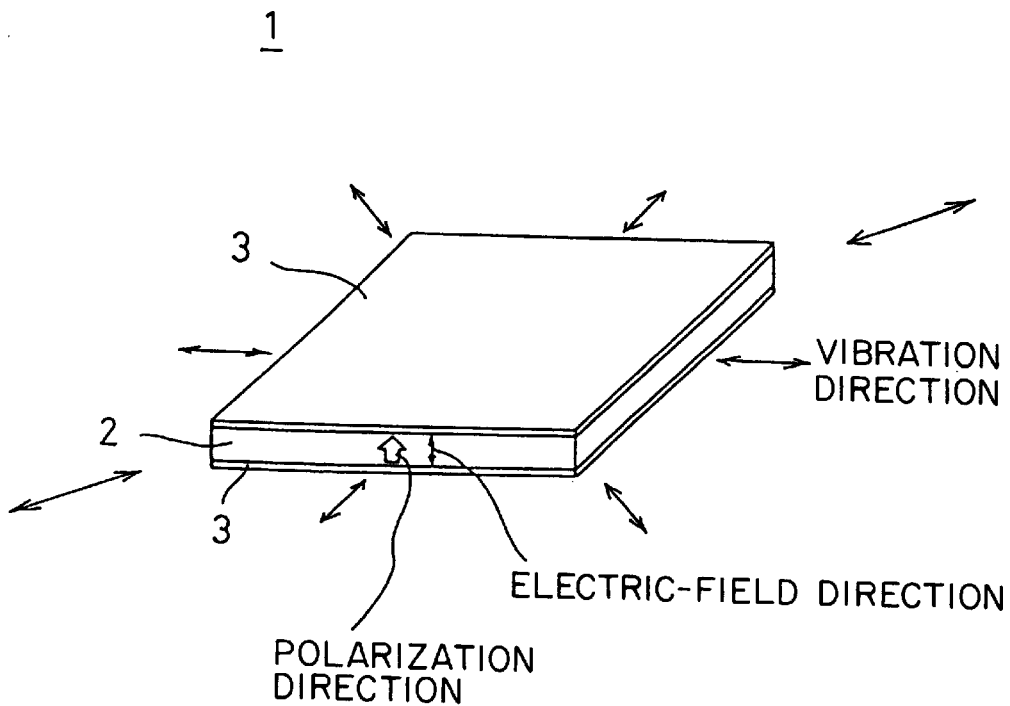
FIG. 29 is a view of another conventional unstiffened piezoelectric resonator.
Figure 30:
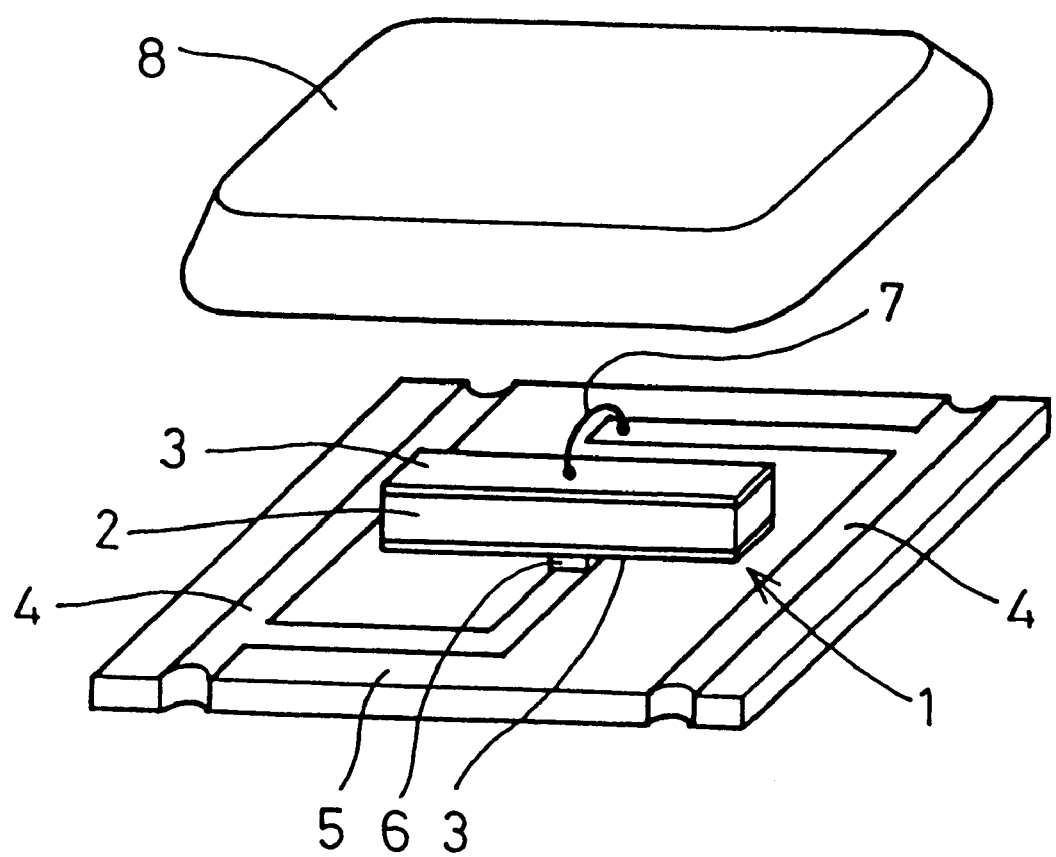
FIG. 30 is an exploded perspective view of a structure in which a conventional unstiffened piezoelectric resonator which vibrates in the longitudinal mode is mounted.

Support members 24 formed at the external electrodes 20 and 22 of piezoelectric resonators 10a, 10b, 10c, and 10d are mounted on these lands to obtain a ladder-shaped circuit shown in FIG. 27. Then, a metal cap (not shown) is placed on the insulating substrate 62.

The electronic component 60 is used as a ladder filter having a ladder-shaped circuit shown in FIG. 27. Two piezoelectric resonators 10a and 10d serve as series resonators and the other two piezoelectric resonator 10b and 10c serve as parallel resonators. In such a ladder filter, the parallel piezoelectric resonators 10b and 10c are designed to have substantially larger capacitances than the series piezoelectric resonators 10a and 10d.

Attenuation in the ladder filter is determined by the capacitance ratio between the series resonators and the parallel resonators. In this electronic component 60, the capacitance can be adjusted by changing the number of laminated layers used in the piezoelectric resonators 10a to 10d. Therefore, a ladder filter having a larger attenuation with fewer resonators is implemented by changing the capacitances of the piezoelectric resonators, as compared with a case where the conventional unstiffened piezoelectric resonators are used. Since the piezoelectric resonators 10a to 10d have a larger ΔF than the conventional piezoelectric resonator, a wider transmission frequency band is implemented as compared with the conventional piezoelectric resonator.

Since the preferred embodiments of the present invention employs a stiffened piezoelectric resonator, the resonator has a larger ΔF and a wider frequency band than the conventional unstiffened piezoelectric resonator. In addition, the stiffened piezoelectric resonator has small spurious vibrations. Since the base member 12 has a laminated structure, the capacitance can be easily set to any desired value and it is easy to achieve impedance matching with an external circuit. Furthermore, by adjusting the sizes and positions of the active section and the inactive sections, ΔF can be changed. Since the electronic component 60 according to the preferred embodiments of the present invention has a simple structure, it can be produced at a low cost while exhibiting the above-described features of the piezoelectric resonator 10.

With the use of the method for manufacturing a piezoelectric resonator according to the preferred embodiments of the present invention, the piezoelectric. resonator 10 having the above-described characteristics is easily mass-produced. Therefore, the piezoelectric resonator 10 can be manufactured at low cost.

Since the piezoelectric resonator 10 according to the preferred embodiments of the present invention includes more parameters which can be designed than the conventional piezoelectric resonator, various characteristics can be implemented.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A piezoelectric resonator comprising:
   a piezoelectric base member having a first side surface and a second side surface;
   an active section constituting at least a first portion of said piezoelectric base member, the first portion of the piezoelectric base member being polarized in a longitudinal direction of said piezoelectric base member and generates longitudinal vibration in said piezoelectric base member when an electric field is applied in the longitudinal direction of said piezoelectric base member and such that a node point of the piezoelectric base member is defined approximately at a center of the piezoelectric base member;
   at least one pair of internal electrodes disposed in said active section such that the at least one pair of internal electrodes are substantially perpendicular to the longitudinal direction of said piezoelectric base member wherein ends of the at least one pair of internal electrodes are exposed at the first side surface of said piezoelectric base member;
   a first insulating film covering a first one of the at least one pair of internal electrodes exposed at said first side surface, at a first end of said first side surface of said piezoelectric base member;
   a second insulating film covering a second one of the at least one pair of internal electrodes exposed at said first side surface which are not covered by said first insulating film, at a second end of said first side surface of said piezoelectric base member; and
   two external electrodes arranged to extend in the longitudinal direction of the piezoelectric base member and being located at one of the first end and the second end of said one first side surface of said piezoelectric base member, said two external electrodes being connected to the at least one pair of internal electrodes exposed at each of the first and second ends of said first side surface without being covered by the first and second insulating films.

2. A piezoelectric resonator according to claim 1, further comprising a groove formed between said two external electrodes on said first side surface of said piezoelectric base member.

3. A piezoelectric resonator according to claim 1, further comprising a first and second electrically conductive support member each in contact with a respective one of said two external electrodes at an approximate center of said piezoelectric base member.

4. An electronic component comprising:
   a piezoelectric resonator including:
      a piezoelectric base member having a first side surface and a second side surface;
      an active section constituting at least a first portion of said piezoelectric base member, the first portion of the piezoelectric base member being polarized in a longitudinal direction of said piezoelectric base member and generates longitudinal vibration in said piezoelectric base member when an electric field is applied in the longitudinal direction of said piezoelectric base member;
      at least one pair of internal electrodes disposed in said active section such that the at least one pair of internal electrodes are substantially perpendicular to the longitudinal direction of said piezoelectric base member, ends of the internal electrodes being exposed at the first side surface of said piezoelectric base member;
      a first insulating film covering an alternate one of the at least one pair of internal electrodes exposed at said first side surface, at a first end of said first side surface of said piezoelectric base member;
      a second insulating film covering the internal electrodes exposed at said first side surface which are not covered by said first insulating film, at a second end of said first side surface of said piezoelectric base member;

two external electrodes arranged to extend in the longitudinal direction of the piezoelectric base member and being located at one of the first end and the second end of said first side surface of said piezoelectric base member, said two external electrodes being connected to the at least one pair of internal electrodes exposed at each of the first and second ends of said first side surface without being covered by the first and second insulating films; and a substrate including a pattern electrode disposed on a surface thereof, said piezoelectric resonator being mounted on said substrate and said pattern electrode being electrically connected to said two external electrodes of said piezoelectric resonator.

5. An electronic component according to claim 4, further comprising a first and second electrically conductive support member each in contact with a respective one of said two external electrodes at an approximate center of said piezoelectric base member for electrically connecting said pattern electrode to said two external electrodes.

6. An electronic component according to claim 4, wherein a plurality of said piezoelectric resonators are provided and arranged to define a ladder filter and a plurality of said pattern electrodes are provided on said substrate, said pattern electrodes being electrically connected to said external electrodes of said plurality of said piezoelectric resonators.

7. A manufacturing method for a piezoelectric resonator comprising the steps of:

preparing a laminated base member by laminating a plurality of piezoelectric layers and a plurality of internal electrodes;

forming an insulating film on a surface of said laminated base member at which ends of said internal electrodes are exposed;

forming an external electrode on said surface of said laminated base member on which said insulating film is formed;

forming a support member on said external electrode with an electrically conductive material;

forming a groove in said surface of said laminated base member on which said external electrode is formed; and cutting said laminated base member in a direction that is substantially parallel to said groove.

8. A manufacturing method for a piezoelectric resonator according to claim 7, wherein said insulating film is formed in a check pattern including a plurality of rows, a first portion of said plurality of rows of said insulating film covering alternate exposed portions of said internal electrodes and a second portion of second plurality of rows of said insulating film covering remaining alternate exposed portions of said internal electrodes.

9. A manufacturing method for a piezoelectric resonator according to claim 8, wherein said groove is formed between adjacent rows of said insulating film formed in said check pattern, and said laminated base member is cut along the rows of said insulating film formed in the check pattern.

10. A manufacturing method for a piezoelectric resonator according to claim 7, wherein said support member is disposed to be substantially parallel to said internal electrodes so that said support member is located at an approximate center of said laminated base member after said laminated base member is cut.

11. A manufacturing method for a piezoelectric resonator according to claim 7, wherein polarizing electrodes are formed on opposite surfaces of the laminated base member and said internal electrodes alternately extend to said polarizing electrodes such that said laminated base member is polarized by applying a DC voltage to said polarizing electrodes, and a piezoelectric resonator is formed by cutting said laminated base member substantially perpendicularly to surfaces of said internal electrodes.

12. A piezoelectric resonator comprising;

a piezoelectric base member having a first side surface and a second side surface;

an active section constituting at least a first portion of said piezoelectric base member and an inactive section constituting a second portion of said piezoelectric base member, the first portion of the piezoelectric base member being adapted to generate longitudinal vibration in said piezoelectric base member when an electric field is applied to said piezoelectric base member and such that a node point of the piezoelectric base member is defined approximately at a center of the piezoelectric base member, said inactive section being not polarized;

at least one pair of internal electrodes disposed in said active section such that ends of the at least one pair of internal electrodes are exposed at the first side surface of said piezoelectric base member;

a first insulating film covering an alternate one of the at least one pair of internal electrodes exposed at said first side surface, at a first end of said first side surface of said piezoelectric base member;

a second insulating film covering the internal electrodes exposed at said first side surface which are not covered by said first insulating film, at a second end of said first side surface of said piezoelectric base member; and two external electrodes arranged to extend in the longitudinal direction of the piezoelectric base member and being connected to the at least one pair of internal electrodes exposed at each of the first and second ends of said first side surface without being covered by the first and second insulating films.

13. A piezoelectric resonator according to claim 12, further comprising a groove formed between said two external electrodes on said first side surface of said piezoelectric base member.

14. A piezoelectric resonator according to claim 12, further comprising a first and second electrically conductive support member each in contact with a respective one of said two external electrodes at an approximate center of said piezoelectric base member.

15. An electronic component comprising:

a piezoelectric resonator including:

a piezoelectric base member having a first side surface and a second side surface;

an active section constituting at least a first portion of said piezoelectric base member and an inactive section constituting a second portion of said piezoelectric base member, the first portion of the piezoelectric base member being adapted to generate longitudinal vibration in said piezoelectric base member when an electric field is applied to said piezoelectric base member, said inactive section being not polarized;

at least one pair of internal electrodes disposed in said active section such that ends of the at least one pair of internal electrodes are exposed at the first side surface of said piezoelectric base member;

a first insulating film covering an alternate one of the at least one pair of internal electrodes exposed at said first side surface, at a first end of said first side surface of said piezoelectric base member;

a second insulating film covering the internal electrodes exposed at said first side surface which are not covered by said first insulating film, at a second end of said first side surface of said piezoelectric base member;

two external electrodes arranged to extend in the longitudinal direction of the piezoelectric base member and being located at one of the first end and the second end of said first side surface of said piezoelectric base member, said two external electrodes being connected to the at least one pair of internal electrodes exposed at each of the first and second ends of said first side surface without being covered by the first and second insulating films; and a substrate including a pattern electrode disposed on a surface thereof, said piezoelectric resonator being mounted on said substrate and said pattern electrode being electrically connected to said two external electrodes of said piezoelectric resonator.

16. An electronic component according to claim 15, further comprising a first and second electrically conductive support member each in contact with a respective one of said two external electrodes at an approximate center of said piezoelectric base member for electrically connecting said pattern electrode to said two external electrodes.

17. An electronic component according to claim 15, wherein a plurality of said piezoelectric resonators are provided and arranged to define a ladder filter and a plurality of said pattern electrodes are provided on said substrate, said pattern electrodes being electrically connected to said external electrodes of said plurality of said piezoelectric resonators.

18. A method of manufacturing a piezoelectric resonator comprising the steps of:

preparing an integral base unit containing a plurality of piezoelectric layers and a plurality of internal electrodes;

forming an insulating film on a surface of said integral base unit at which ends of said internal electrodes are exposed;

forming an external electrode on said surface of said integral base unit on which said insulating film is formed;

providing a support member on said external electrode;

forming a groove in said surface of said integral base unit on which said external electrode is formed; and cutting said integral base unit in a direction that is substantially parallel to said groove.

19. A method of manufacturing a piezoelectric resonator according to claim 18, wherein said integral base unit is prepared by laminating a plurality of piezoelectric layers and a plurality of internal electrodes.

20. A method of manufacturing a piezoelectric resonator according to claim 18, wherein said insulating film is formed in a check pattern including a plurality of rows, a first portion of said plurality of rows of said insulating film covering alternate exposed portions of said internal electrodes and a second portion of second plurality of rows of said insulating film covering remaining alternate exposed portions of said internal electrodes.

* * * * *